(12) United States Patent
Cong

(10) Patent No.: US 12,497,693 B2
(45) Date of Patent: Dec. 16, 2025

(54) MODULAR FLOW CHAMBER KITS, PROCESSING CHAMBERS, AND RELATED APPARATUS AND METHODS APPLICABLE FOR SEMICONDUCTOR MANUFACTURING

(71) Applicant: Applied Materials, Inc., Santa Clara, CA (US)

(72) Inventor: Zhepeng Cong, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 18/618,210

(22) Filed: Mar. 27, 2024

(65) Prior Publication Data
US 2025/0305137 A1    Oct. 2, 2025

(51) Int. Cl.
*C23C 16/455* (2006.01)
*C23C 16/44* (2006.01)
*H01L 21/67* (2006.01)
*H01L 21/687* (2006.01)

(52) U.S. Cl.
CPC .... *C23C 16/45551* (2013.01); *C23C 16/4404* (2013.01); *C23C 16/45527* (2013.01); *H01L 21/67028* (2013.01); *H01L 21/67069* (2013.01); *H01L 21/68742* (2013.01); *H01L 21/68792* (2013.01)

(58) Field of Classification Search
USPC ....... 118/719, 729; 137/599.01–601.21, 625, 137/625.28; 277/431, 432
See application file for complete search history.

(56) References Cited

U.S. PATENT DOCUMENTS

| | | | |
|---|---|---|---|
| 3,071,384 A * | 1/1963 | Friberg | F16J 15/406 |
| | | | 415/168.3 |
| 5,898,179 A | 4/1999 | Smick et al. | |
| 6,443,618 B1 * | 9/2002 | Nishikawa | F16C 32/0651 |
| | | | 277/351 |

(Continued)

FOREIGN PATENT DOCUMENTS

| KR | 2009-0087174 A | 8/2009 | |
|---|---|---|---|
| WO | WO-2022064606 A1 * | 3/2022 | ........... C23C 16/045 |

OTHER PUBLICATIONS

International Search Report and Written Opinion dtd Jun. 9, 2025 for Application No. PCT/US2025/018126.

*Primary Examiner* — Matthew W Jellett
(74) *Attorney, Agent, or Firm* — Patterson + Sheridan, LLP

(57) ABSTRACT

Embodiments of the present disclosure relate to modular flow chamber kits, processing chambers, and related apparatus and methods applicable for semiconductor manufacturing. In one or more embodiments, a processing chamber includes a chamber body at least partially defining a processing volume. The chamber body includes a plurality of inject passages arranged in a plurality of flow levels, and one or more exhaust passages formed in the chamber body. The processing chamber includes one or more heat sources operable to heat the processing volume, a substrate support disposed in the processing volume, and a plate spaced from the substrate support. The substrate support and the plate are movable by at least one flow level of the plurality of flow levels to align the substrate support between one or more first inject passages of a first flow level and one or more second inject passages of a second flow level.

19 Claims, 14 Drawing Sheets

(56) References Cited

U.S. PATENT DOCUMENTS

| | | | |
|---|---|---|---|
| 6,805,487 B1* | 10/2004 | Yuasa | B23Q 11/0883 |
| | | | 277/913 |
| 7,528,392 B2 | 5/2009 | England et al. | |
| 8,888,087 B2* | 11/2014 | Okabe | C23C 16/45563 |
| | | | 269/903 |
| 8,960,235 B2* | 2/2015 | Carlson | H01J 37/32633 |
| | | | 137/340 |
| 8,992,213 B2* | 3/2015 | Moller | F27D 7/04 |
| | | | 415/110 |
| 9,112,064 B2 | 8/2015 | Kellerman et al. | |
| 9,162,209 B2* | 10/2015 | Leeser | B01J 19/0006 |
| 9,613,838 B2* | 4/2017 | Okada | C23C 16/4584 |
| 9,869,019 B2* | 1/2018 | Yang | C23C 16/0245 |
| 10,597,779 B2 | 3/2020 | Weaver et al. | |
| 11,742,189 B2* | 8/2023 | White | H01J 37/32899 |
| | | | 156/345.31 |
| 11,938,493 B2* | 3/2024 | Myoung | B05B 12/124 |
| 12,385,159 B2* | 8/2025 | Cong | C23C 16/52 |
| 2003/0049372 A1* | 3/2003 | Cook | C23C 16/345 |
| | | | 118/724 |
| 2008/0190558 A1* | 8/2008 | Bailey | H01L 21/6719 |
| | | | 257/E21.252 |
| 2008/0210163 A1* | 9/2008 | Carlson | C23C 16/22 |
| | | | 118/715 |
| 2010/0075488 A1 | 3/2010 | Collins et al. | |
| 2012/0240853 A1* | 9/2012 | Carlson | C23C 16/45578 |
| | | | 118/715 |
| 2014/0322897 A1* | 10/2014 | Samir | C23C 16/45519 |
| | | | 118/733 |
| 2015/0329970 A1* | 11/2015 | Khan | H01L 21/68742 |
| | | | 118/719 |
| 2016/0122873 A1* | 5/2016 | Iwasaki | H01J 37/32449 |
| | | | 239/548 |
| 2018/0182649 A1 | 6/2018 | Inoue et al. | |
| 2023/0167581 A1* | 6/2023 | Shah | H05B 3/0047 |
| | | | 118/725 |
| 2023/0193465 A1* | 6/2023 | Tateno | C23C 16/45502 |
| | | | 118/719 |
| 2023/0230859 A1* | 7/2023 | Tannous | H05B 3/0047 |
| | | | 392/416 |
| 2023/0407478 A1 | 12/2023 | Cong et al. | |
| 2024/0021444 A1 | 1/2024 | Subbanna et al. | |
| 2024/0363448 A1* | 10/2024 | Cong | H01L 22/12 |
| 2025/0037975 A1* | 1/2025 | Cong | H01J 37/32449 |

\* cited by examiner

MODULAR FLOW CHAMBER KITS, PROCESSING CHAMBERS, AND RELATED APPARATUS AND METHODS APPLICABLE FOR SEMICONDUCTOR MANUFACTURING

BACKGROUND

Field

Embodiments of the present disclosure relate to modular flow chamber kits, processing chambers, and related apparatus and methods applicable for semiconductor manufacturing.

Description of the Related Art

Semiconductor substrates are processed for a wide variety of applications, including the fabrication of integrated devices and micro-devices. One method of processing substrates includes depositing a material, such as a dielectric material or a semiconductor material, on an upper surface of the substrate. The material may be deposited in a lateral flow chamber by flowing a process gas parallel to the surface of a substrate positioned on a support, and thermally decomposing the process gas to deposit a material from the gas onto the substrate surface.

However, operations (such as epitaxial deposition operations) can be long, expensive, and inefficient, and can have limited capacity and throughput. For example, deposition can be limited with respect to selectivity, which can involve additional need for etching and/or changing of process recipes. As another example, is can be difficult to uniformly deposit and/or uniformly etch a variety of structures. As a further example, the sharpness of structures (such as boundaries between deposited layers) can be limited.

Therefore, a need exists for improved apparatus and methods in semiconductor processing.

SUMMARY

Embodiments of the present disclosure relate to modular flow chamber kits, processing chambers, and related apparatus and methods applicable for semiconductor manufacturing.

In one or more embodiments, a processing chamber applicable for semiconductor manufacturing includes a chamber body. The chamber body at least partially defines a processing volume. The chamber body includes a plurality of inject passages formed in the chamber body and arranged in a plurality of flow levels, and one or more exhaust passages formed in the chamber body. The processing chamber includes one or more heat sources operable to heat the processing volume, a substrate support disposed in the processing volume, and a plate spaced from the substrate support. The substrate support and the plate are movable by at least one flow level of the plurality of flow levels to align the substrate support between one or more first inject passages of a first flow level and one or more second inject passages of a second flow level.

In one or more embodiments, a chamber kit applicable for semiconductor manufacturing includes a liner and a plate. The liner includes an inner face, one or more first flow openings extending into the inner face, one or more second flow openings extending into the inner face on a first side of the one or more first flow openings, and one or more third flow openings extending into the inner face on a second side of the one or more first flow openings. The plate od sized and shaped for positioning within the inner face of the liner. The plate includes an outer section sized and shaped to span the one or more first flow openings, the one or more second flow openings, and the one or more third flow openings.

In one or more embodiments, a method of substrate processing includes flowing a first gas flow into a first flow level of a processing chamber and over a substrate, and flowing a second gas flow into a second flow level of the processing chamber and over a plate disposed above or below the substrate. The method includes heating the substrate. and moving the substrate away from the first flow level while the first gas flow flows into the first flow level.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
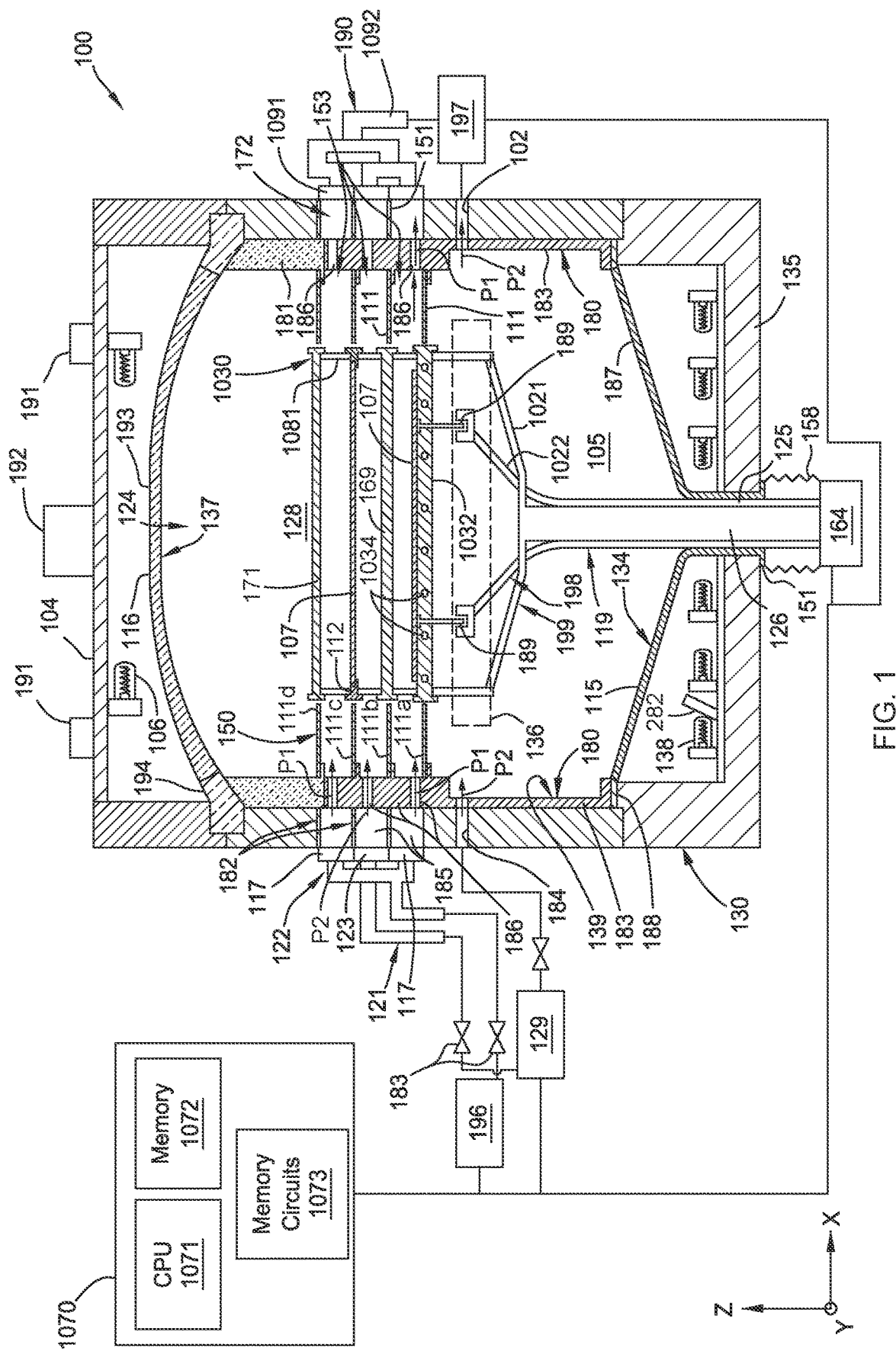
FIG. 1 is a schematic cross-sectional side view of a processing chamber, according to one or more embodiments.

For visual clarity purposes, hatching is omitted from FIGS. 3A-3E. For visual clarity purposes, certain hatching is omitted from FIGS. 1, 2, 5, 6, and 10A-10D.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure relate to modular flow chamber kits, processing chambers, and related apparatus and methods applicable for semiconductor manufacturing. The subject matter described herein can be used to process a single substrate at a time or two or more substrates simultaneously.

The disclosure contemplates that terms such as "couples," "coupling," "couple," and "coupled" may include but are not limited to embedding, bonding, welding, fusing, melting together, interference fitting, and/or fastening such as by using bolts, threaded connections, pins, and/or screws. The disclosure contemplates that terms such as "couples," "coupling," "couple," and "coupled" may include but are not limited to integrally forming. The disclosure contemplates that terms such as "couples," "coupling," "couple," and "coupled" may include but are not limited to direct coupling and/or indirect coupling, such as indirect coupling through components such as links, blocks, and/or frames.

Figure 2:
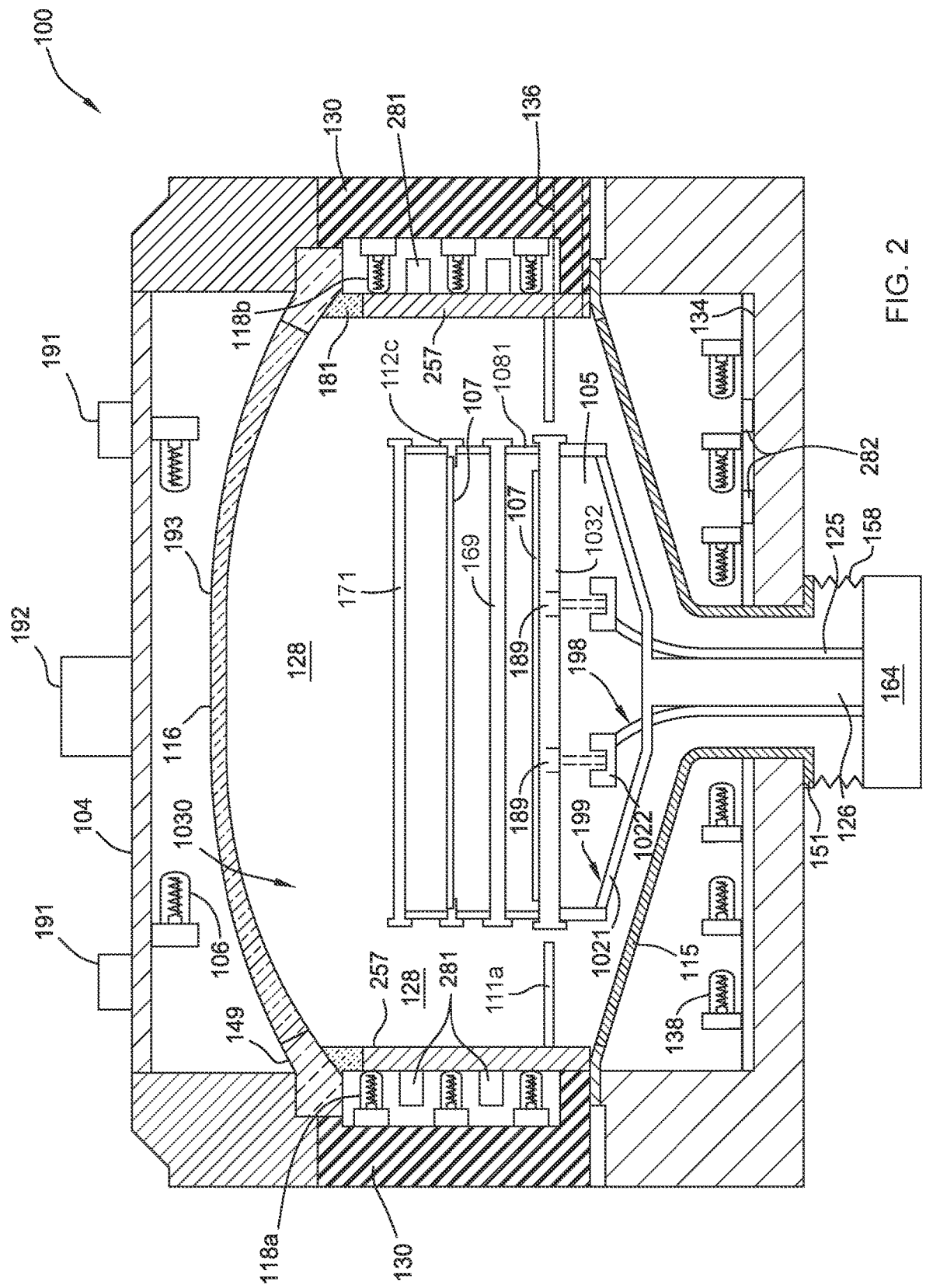
FIG. 2 is a schematic cross-sectional side view of the processing chamber shown in FIG. 1, according to one or more embodiments.

FIG. 1 is a schematic cross-sectional side view of a processing chamber 100, according to one or more embodiments. The side heat sources 118a, 118b shown in FIG. 2 are not shown in FIG. 1 for visual clarity purposes. The processing chamber 100 includes a chamber body 130 that defines an internal volume 124. The internal volume 124 includes a processing volume 128.

A chamber kit 150 is positioned in the processing volume 128 and at least partially supported by a substrate support assembly 119 (such as a pedestal assembly and/or a ring assembly). The chamber kit 150 includes a substrate support 1032, a plate 169 spaced from the substrate support 1032, and a second plate 171 spaced from the plate 169. The chamber kit 150 includes a plurality of levels that support a plurality of substrates 107 (two are shown) for simultaneous processing (e.g., epitaxial deposition). The processing can include atomic layer epitaxy deposition. In the implementation shown in FIG. 1, the chamber kit 150 supports two substrates. The chamber kit 150 can support other numbers of substrates, including but not limited to one substrate 107, three substrates 107, four substrates 107, six substrates 107, or eight substrates 107. The processing chamber 100 includes an upper window 116, such as a dome, disposed between a lid 104 and the processing volume 128.

The processing chamber 100 includes a lower window 115 disposed below the processing volume 128. One or more upper heat sources 106 are positioned above the processing volume 128 and the upper window 116. The one or more upper heat sources 106 can be radiant heat sources such as lamps, for example halogen lamps. The one or more upper heat sources 106 are disposed between the upper window 116 and the lid 104. The upper heat sources 106 can be positioned to facilitate uniform heating of the substrates 107. One or more lower heat sources 138 are positioned below the processing volume 128 and the lower window 115. The one or more lower heat sources 138 can be radiant heat sources such as lamps, for example halogen lamps. The lower heat sources 138 are disposed between the lower window 115 and a floor 134 of the internal volume 124. The lower heat sources 138 can be positioned to facilitate uniform heating of the substrates 107.

The present disclosure contemplates that other heat sources may be used (in addition to or in place of the lamps) for the various heat sources described herein. For example, resistive heaters, light emitting diodes (LEDs), and/or lasers may be used for the various heat sources described herein.

The upper and lower windows 116, 115 may be transparent to the infrared radiation, such as by transmitting at least 80% (such as at least 95%) of infrared radiation. The upper and lower windows 116, 115 may be a quartz material (such as a transparent quartz). In one or more embodiments, the upper window 116 includes an inner window 193 and outer window supports 194. The inner window 193 may be a thin quartz window. The outer window supports 194 support the inner window 193 and are at least partially disposed within a support groove. In one or more embodiments, the lower window 115 includes an inner window 187 and outer window supports 188. The inner window 187 may be a thin quartz window. The outer window supports 188 support the inner window 187.

The substrate support assembly 119 is disposed in the processing volume 128. One or more liners 180 are disposed in the processing volume 128 and surround the substrate support assembly 119. The one or more liners 180 facilitate shielding the chamber body 130 from processing chemistry in the processing volume 128. The chamber body 130 is disposed at least partially between the upper window 116 and the lower window 115. The one or more liners 180 are disposed between the processing volume 128 and the chamber body 130. The one or more liners 180 include an upper liner 181 and one or more lower liners 183.

The processing chamber 100 includes one or more gas inject passages 182 (a plurality is shown in FIG. 1) formed in the chamber body 130 and in fluid communication with the processing volume 128, and one or more gas exhaust passages 172 (a plurality is shown in FIG. 1) formed in the chamber body 130 opposite the one or more gas inject passages 182. The one or more gas exhaust passages 172 are in fluid communication with the processing volume 128. Each of the one or more gas inject passages 182 and one or more gas exhaust passages 172 are formed through one or more sidewalls of the chamber body 130 and through the one or more liners 180 that line the one or more sidewalls of the chamber body 130.

Each gas inject passage 182 includes a gas channel 185 formed in the chamber body 130 and one or more gas openings 186 (a plurality is shown in FIG. 1) formed in the one or more liners 180. One or more supply conduit systems are in fluid communication with the one or more gas inject passages 182. In FIG. 1, an inner supply conduit system 121 and an outer supply conduit system 122 are in fluid communication with a plurality of gas inject passages 182. The inner supply conduit system 121 includes an inner gas box 123 mounted to the chamber body 130 and in fluid communication with an inner set of the gas inject passages 182. The outer supply conduit system 122 includes a plurality of outer gas boxes 117 mounted to the chamber body 130 and in fluid communication with an outer set of the gas inject passages 182. The present disclosure contemplates that a variety of gas supply systems (e.g., supply conduit system(s), gas inject passages, and/or gas boxes different than what is shown in FIG. 1) may be used.

The processing chamber 100 includes a chamber kit 150. The chamber kit 150 includes a plurality of pre-heat rings 111a-111d positioned outwardly of the substrates 107, the substrate support 1032, and the plate 169. Four pre-heat rings 111a-111d are shown in FIG. 1. Other numbers (such as two or three) of the pre-heat rings 111 may be used. The chamber kit 150 divides the processing volume into a plurality of flow levels 153 (three flow levels are shown in FIG. 1). In one or more embodiments, the chamber kit 150 includes at least two (such as at least three) flow levels 153. The one or more gas inject passages 182 are positioned as a plurality of inject levels such that each gas inject passage 182 corresponds to one of the plurality of inject levels. Each inject level aligns with a respective flow level 153. The pre-heat rings 111a-111d are coupled to and/or at least partially supported by the one or more liners 180. In one or more embodiments, the pre-heat rings 111a-111d each include a complete ring or one or more ring segments, such as a C-ring segment and/or a plurality of ring segments. One or more heating elements 1034 (a plurality is shown) are disposed in (e.g., embedded in) the substrate support 1032. The heating element(s) 103 can include, for example, inductive heaters, resistive heating wires, and/or solid state heaters. Other heating elements are contemplated.

The chamber kit 150 includes an arcuate support 112. The substrate support 1032 supports one of the substrates 107 and the arcuate support 112 is configured to support another of the substrates 107. The chamber kit 150 also includes one or more support rod structures 1081 (a plurality is shown) that support the arcuate support 112, the substrate support 1032, the plate 169, and the second plate 171. The one or more support rod structures 1081 are sized and shaped to extend through the substrate support 1032, through the plate 169, through the arcuate support 112, and into the second plate 171. In one or more embodiments, the substrate support 1032 includes a pedestal, such as a susceptor. In one or more embodiments, the substrate support 1032 includes a complete ring or one or more ring segments, such as a C-ring segment and/or a plurality ring segments. In such an embodiment, the substrate support 1032 is arcuate.

The substrate support 1032, the plate 169, and the second plate 171 are movable (e.g., upwardly and downwardly) by at least one flow level 173 of the plurality of flow levels 173 to respectively align the substrate support 1032 and the arcuate support 112 between one or more first inject passages of a first flow level 173 and one or more second inject passages of a second flow level 173. As an example, the substrate support 1032 can be moved from a first flow level 173 (e.g., associated with a first pre-heat ring 111a) and to a second flow level 173 (e.g., associated with a second pre-heat ring 111b). The movements are described further, for example, in relation to FIGS. 3A-3E and FIGS. 10A-10D below.

During operations (such as during an epitaxial deposition operation), one or more process gases P1 are supplied to the processing volume 128 through the outer supply conduit system 122, and through the one or more gas inject passages 182. The one or more process gases P1 are supplied from one or more gas sources 196 in fluid communication with the one or more gas inject passages 182. Each of the gas inject passages 182 is configured to direct the one or more processing gases P1 in a generally radially inward direction towards the chamber kit 150. As such, in one or more embodiments, the gas inject passages 182 may be part of a cross-flow gas injector. The flow(s) of the one or more process gases P1 can be divided into at least some (such as two or more) of the plurality of flow levels 153. For at least the uppermost flow level 153 (or a single flow level 153—if a single flow level 153 is used), the one or more process gases P1 can be guided (using the second plate 171) along a streamlined flow path such that diversive flow away from the uppermost substrate 107 (or a single substrate 107—if a single substrate 107 is used) is reduced or eliminated.

The processing chamber 100 includes an exhaust conduit system 190. The one or more process gases P1 can be exhausted through exhaust gas openings formed in the one or more liners 180, exhaust gas channels formed in the chamber body 130, and then through exhaust gas boxes 1091. The one or more process gases P1 can flow from exhaust gas boxes 1091 and to an optional common exhaust box 1092, and then out through a conduit using one or more pump devices 197 (such as one or more vacuum pumps).

The one or more processing gases P1 can include, for example, purge gases, cleaning gases, and/or deposition gases. The deposition gases can include, for example, one or more reactive gases carried in one or more carrier gases. The one or more reactive gases can include, for example, silicon and/or germanium containing gases (such as silane ($SiH_4$), disilane ($Si_2H_6$), dichlorosilane ($SiH_2Cl_2$), and/or germane ($GeH_4$)), chlorine containing etching gases (such as hydrogen chloride (HCl)), and/or dopant gases (such as phosphine ($PH_3$) and/or diborane ($B_2H_6$)). One or more inert gases (e.g., the purge gases and/or carrier gases) can include, for example, one or more of argon (Ar), helium (He), nitrogen ($N_2$), hydrogen chloride (HCl), and/or hydrogen ($H_2$). In one or more embodiments, the one or more processing gases P1 include silicon (Si), germanium (Ge), and boron (B), and the one or more processing gases P1 are used to form film including silicon (Si), carbon (C), and phosphorus (P).

Inert gas P2 (e.g., purge gas) supplied from an inert gas source 129 is introduced to a bottom region 105 of the internal volume 124 through one or more lower gas inlets 184 formed in the sidewall of the chamber body 130. The inert gas P2 can also be supplied through the inner supply conduit system 121 and over the plate 169 positioned between the two substrates 107.

The one or more lower gas inlets 184 are disposed at an elevation below the one or more gas inject passages 182. If the one or more liners 180 are used, a section of the one or more liners 180 may be disposed between the one or more gas inject passages 182 and the one or more lower gas inlets 184. The one or more lower gas inlets 184 are configured to direct the inert gas P2 in a generally radially inward direction. The one or more lower gas inlets 184 may be configured to direct the inert gas P2 in an upward direction. During a film formation process, the substrate support assembly 119 is located at a position that can facilitate the inert gas P2 to flow generally along a flow path across a back side of the substrate support 1032. The inert gas P2 exits the bottom region 105 and is exhausted out of the processing chamber 100 through one or more lower gas exhaust passages 102 located on the opposite side of the processing volume 128 relative to the one or more lower gas inlets 184.

The substrate support assembly 119 includes a first lift frame 199 and a second lift frame 198 disposed at least partially about the first lift frame 199. The first lift frame 199 includes first arms 1021 coupled to the substrate support 1032 such that lifting and lowering the first lift frame 199 lifts and lowers the substrates 107, the substrate support 1032, the second plate 171, and the plate 169. A plurality of lift pins 189 are suspended from the substrate support 1032. Lowering of the substrate support 1032 and/or lifting of the second lift frame 198 initiates contact of the lift pins 189 with arms 1022 of the second lift frame 198. Continued lowering of the first plate 1032 and/or lifting of the second lift frame 198 initiates contact of the lift pins 189 with a substrate 107 and/or the plate 169 such that the lift pins 189 raise the substrate 107 and/or the plate 169. A bottom region 105 of the processing chamber 100 is defined between the floor 134 and a cassette 1030. As shown in FIG. 1, the lift pins 189 can be configured to abut against—and be lifted from—the arms 1022.

A first shaft 126 of the first lift frame 199, a second shaft 125 of the second lift frame 198, and a section 151 of the lower window 115 extend through a port formed in a base 135 of the chamber body 130 and the floor 134. Each shaft 125, 126 is coupled to one or more respective motors 164, which are configured to independently raise, lower, and/or rotate the substrates 107 and the plate 169 using the first lift frame 199, and to independently raise and lower the lift pins 189 using the second lift frame 198. The first lift frame 199 includes the first shaft 126 and a plurality of first arms 1021 configured to support the first plate 1032, the arcuate support 112, the plate 169, and the second plate 171.

The arcuate support 112 is part of the cassette 1030 supported by the first lift frame 199 and disposed in the processing volume 128. The plurality of inject passages 182 are in fluid communication with respective flow paths above the substrate support 1032, the plate 169, and the arcuate support 112.

The second lift frame 198 includes the second shaft 125 and the plurality of second arms 1022 configured to interface with and support the lift pins 189. A bellows assembly 158 circumscribes and encloses a portion of the shafts 125, 126 disposed outside the chamber body 130 to facilitate reduced or eliminated vacuum leakage outside the chamber body 130.

An opening 136 (a substrate transfer opening) is formed through the one or more sidewalls of the chamber body 130. The opening 136 may be used to transfer the plate 169 and/or the substrates 107 to or from the substrate support 1032 and the arcuate support 112, e.g., in and out of the internal volume 124. In one or more embodiments, the opening 136 includes a slit valve. In one or more embodiments, the opening 136 may be connected to any suitable valve that enables the passage of substrates therethrough. The opening 136 is shown in ghost in FIGS. 1 and 2 for visual clarity purposes.

The processing chamber 100 may include one or more sensors 191, 192, 282, such as temperature sensors (e.g., optical pyrometers) or other metrology sensors, which measure temperatures (or other parameters) within the processing chamber 100 (such as on the surfaces of the upper window 116, the first plate 1032, the second plate 171, the plate 169, the arcuate support 112, the pre-heat rings 111a-111d, and/or the substrates 107). The one or more sensors 191, 192, 282 are disposed on the lid 104. The one or more sensors 282 (e.g., lower pyrometers)—which are shown in FIG. 2—are disposed on a lower side of the lower window 115. The one or more sensors 282 can be disposed adjacent to and/or on the base 135 of the chamber body 130.

In one or more embodiments, upper sensors 191, 192 are oriented toward a top of the second plate 171 and/or a top of a fourth pre-heat ring 111d. In one or more embodiments, side sensors 281 (e.g., side temperature sensors) are oriented toward the substrate support 1032, arcuate support 112, and/or the pre-heat rings 111a-111d. In one or more embodiments, one or more lower sensors 282 are oriented toward a bottom of the chamber kit 150 (such as a lower surface of the substrate support 1032, a bottom of the plate 169, a bottom of the second plate 171, and/or a bottom of the first pre-heat ring 111a.

The processing chamber 100 includes a controller 1070 configured to control the processing chamber 100 or components thereof. For example, the controller 1070 may control the operation of components of the processing chamber 100 using a direct control of the components or by controlling controllers associated with the components. In operation, the controller 1070 enables data collection and feedback from the respective chambers to coordinate and control performance of the processing chamber 100.

The controller 1070 generally includes a central processing unit (CPU) 1071, a memory 1072, and support circuits 1073. The CPU 1071 may be one of any form of a general purpose processor that can be used in an industrial setting. The memory 1072, or non-transitory computer readable medium, is accessible by the CPU 1071 and may be one or more of memory such as random access memory (RAM), read only memory (ROM), floppy disk, hard disk, or any other form of digital storage, local or remote. The support circuits 1073 are coupled to the CPU 1071 and may include cache, clock circuits, input/output subsystems, power supplies, and the like.

The various methods and operations disclosed herein may generally be implemented under the control of the CPU 1071 by the CPU 1071 executing computer instruction code stored in the memory 1072 (or in memory of a particular processing chamber) as, e.g., a software routine. When the computer instruction code is executed by the CPU 1071, the CPU 1071 controls the components of the processing chamber 100 to conduct operations in accordance with the various methods and operations described herein. In one or more embodiments, the memory 1072 (a non-transitory computer readable medium) includes instructions stored therein that, when executed, cause the methods and operations described herein to be conducted. The controller 1070 can be in communication with the heat sources, the gas sources, and/or the vacuum pump(s) of the processing chamber 100, for example, to cause a plurality of operations to be conducted.

One or more of the substrate support 1032, the plate 169, the second plate 171, and/or the one or more liners 180 (such as the upper liner 181 and/or the one or more lower liners 183), are formed of one or more of quartz (such as transparent quartz, e.g. clear quartz; opaque quartz, e.g. white quartz, grey quartz, and/or black quartz), silicon carbide (SiC), graphite coated with SiC and/or opaque quartz, and/or one or more ceramics (such as alumina (aluminum oxide ($Al_2O_3$)), Aluminum nitride (AlN), Silicon Nitride ($Si_3N_4$), Boron Nitride (BN), and/or Boron Carbide ($B_4C$))). Other materials are contemplated. In one or more embodiments the plate 169 includes silicon carbide (SiC).

FIG. 2 is a schematic cross-sectional side view of the processing chamber 100 shown in FIG. 1, according to one or more embodiments. The cross-sectional view shown in FIG. 2 is rotated by 55 degrees relative to the cross-sectional view shown in FIG. 1.

The processing chamber 100 includes one or more side heat sources 118a, 118b (e.g., side lamps, side resistive heaters, side LEDs, and/or side lasers, for example) positioned outwardly of the processing volume 128. One or more second side heat sources 118b are opposite one or more first side heat sources 118a across the processing volume 128.

In FIG. 2, the pre-heat rings 111b-111d are not shown for visual clarity purposes. In addition to the one or more sensors 191, 192 positioned above the processing volume 128 and above the second plate 171, the processing chamber 100 may include one or more sensors 281, such as temperature sensors (e.g., optical pyrometers) or other metrology sensors, which measure temperatures (or other parameters) within the processing chamber 100. A plurality of windows 257—if used—can be disposed in gaps between or formed in the one or more liners 180 (such as the upper liner 181 and/or the one or more lower liners 183). The one or more sensors 281 are side sensors (e.g., side pyrometers) that are positioned outwardly of the processing volume 128, outwardly of the pre-heat rings 111a-111d (shown in FIG. 1), and outwardly of the plurality of windows 257. The one or more sensors 281 can be radially aligned, for example, with the plurality of windows 257 (as shown in FIG. 2).

The one or more side sensors 281 (such as one or more pyrometers) can be used to measure temperatures (or other parameters) within the processing volume 128 from respective sides of the processing volume 128. The side sensors 281 are arranged in a plurality of sensor levels (two sensor levels are shown in FIG. 2). In one or more embodiments, the number of sensor levels is equal to the number of heat source levels. Each side sensor 281 can be oriented horizontally or can be directed (e.g., oriented downwardly at an angle) toward the substrate 107 and/or the substrate support 112 of a respective level of the cassette 1030.

The present disclosure contemplates that the side heat sources 118a, 118b, the windows 257, and/or the side sensors 281 can be omitted.

FIGS. 3A-3E are schematic partial side cross-sectional views of the processing chamber 100 and a gas circuit 300 during a method of substrate processing.

The gas circuit 300 includes a first flow controller 310, a first set of valves 311, 312 in fluid communication with the first flow controller 310, and a first supply valve 313 and a first supply line 314 in fluid communication with the first flow controller 310. The first set of valves 311, 312 are in fluid communication with a first set of inject passages 182a. The gas circuit 300 includes a second flow controller 320, a second set of valves 321, 322 in fluid communication with the second flow controller 320, and a second supply valve 323 and a second supply line 324 in fluid communication with the second flow controller 320. The second set of valves 321, 322 and the first set of valves 311, 312 alternate with respect to each other. The second set of valves 321, 322 are in fluid communication with a second set of inject passages 182b. The second set of inject passages 182b and the first set of inject passages 182a alternate with respect to each other along the plurality of flow levels. The gas circuit 300 includes a third flow controller 330, a valve 331 in fluid communication with the third flow controller 330, and a third supply valve 332 and a third supply line 333 in fluid communication with the third flow controller 330. In one or more embodiments, the flow controllers 310, 320, 330 respectively include one or more mass flow controllers. In one or more embodiments the flow controllers 310, 320, 330 respectively are flow ratio controllers (FRCs). The valve 331 is in fluid communication with a lower inject passage 182c below the first set of inject passages 182a and the second set of inject passages 182b.

The gas circuit 300 includes a connection valve 315 in fluid communication between the first supply line 314 and the second supply line 324 at locations downstream of the first supply valve 313 and the second supply valve 323. A second connection valve is 325 is in fluid communication between the third supply line 333 and the first supply line 314 at a location downstream of the first supply valve 313. A third connection valve 335 is in fluid communication between the third supply line 333 and the second supply line at a location downstream of the second supply valve 323.

Figure 3A:
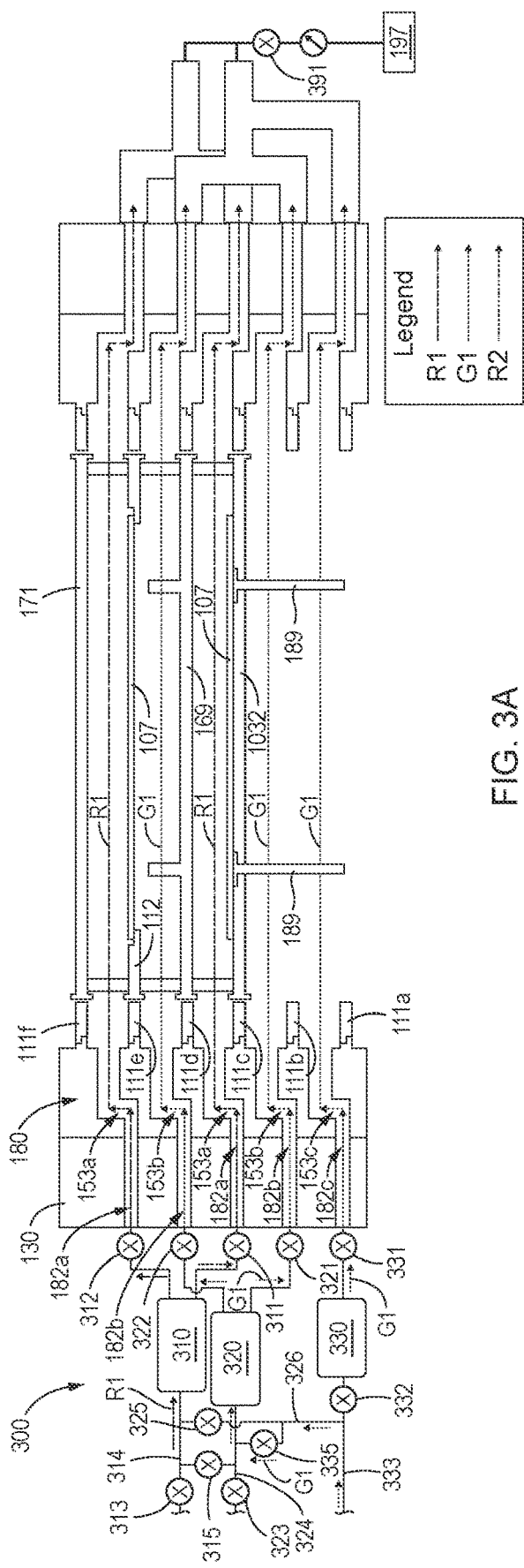
FIGS. 3A-3E are schematic partial side cross-sectional views of the processing chamber and a gas circuit during a method of substrate processing.

As shown in FIG. 3A the method includes flowing a first gas flow into a first set of flow levels 153A of the processing chamber 100, and flowing a second gas flow into a second set of flow levels 153B of the processing chamber 100 simultaneously with the flowing of the first gas flow. The first set of flow levels 153A and the second set of flow levels 153B alternate with respect to each other. The method also includes heating one or more substrates 107 positioned in the processing chamber 100. FIG. 3A shows the substrates 107 in a first position (e.g., an upper position). In one or more embodiments, the one or more substrates 107 include a plurality of substrates 107 (two are shown in FIG. 3A). In one or more embodiments, the first gas flow includes a first reactive gas R1 and the second gas flow includes an inert gas G1. In FIG. 3A, the first supply valve 313 and the first set of valves 311, 312 are open to supply the first reactive gas R1 through the first supply line 314 and the first flow controller 310. The second supply valve 323 and the second connection valve 325 are closed, and the third supply valve 332, the valve 331, and the second set of valves 321, 322 are open to supply the inert gas G1 through the third supply line 333 and a connection line 326. The connection valve 315 is closed in FIG. 3A. In the implementation shown in FIG. 3A, the processing chamber 100 includes five arcuate supports 112a-112e and six pre-heat rings 111a-111f. Other numbers are contemplated. An exhaust valve 391 is in fluid communication with the one or more pump devices 197.

The first set of flow levels 153a correspond respectively to first sides of the plurality of substrates 107 when in the first position such that, in one or more embodiments, the first reactive gas R1 respectively processes the first sides of the plurality of substrates 107. For example, the first reactive gas R1 can respectively form a layer, clean (such as pre-clean), or etch—respectively—the first sides of the plurality of substrates 107. As an example, the first reactive gas R1 can form a first layer 401 (shown in FIG. 4) respectively on the first sides of the plurality of substrates 107.

Figure 3B:
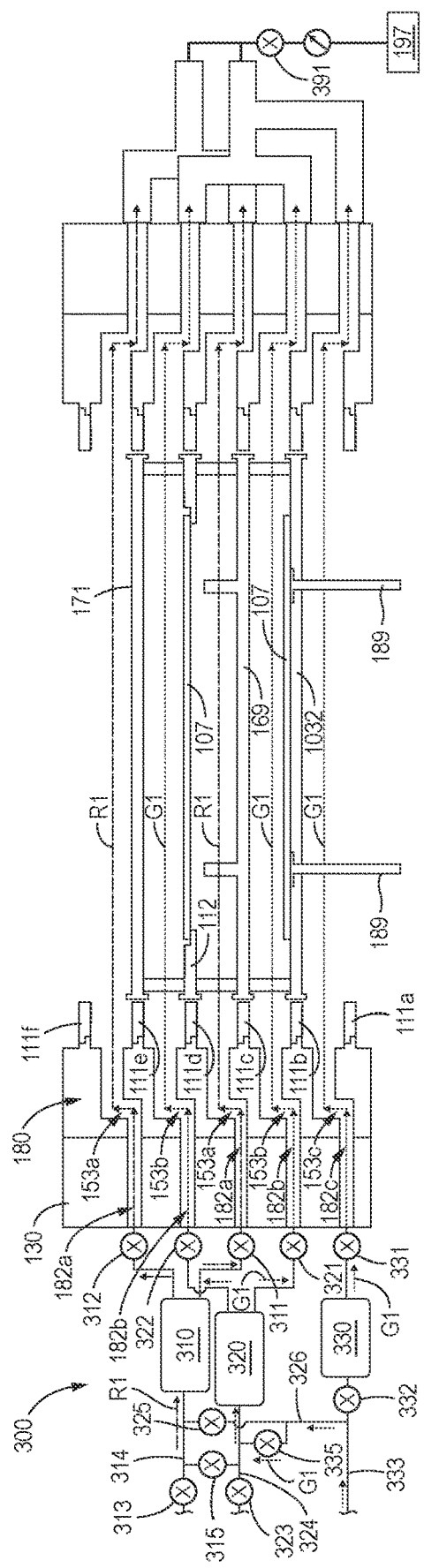

As shown in FIG. 3B, the method includes moving the one or more substrates 107 from the first position to a second position (e.g., a lower position). The one or more substrates 107 are moved away from the respective first flow levels of the first set of flow levels 153a while the first gas flow (e.g., the first reactive gas R1) flows into the first set of flow levels 153a. As the one or more substrates 107 move to the second position, the plate 169 and the second plate 171 respectively isolate (e.g., at least partially) the lower substrate 107 and the upper substrate 107 from the first gas flow. In one or more embodiments, the one or more substrates 107 are moved to the second position without waiting for the first gas flow (e.g., the first reactive gas R1) to stabilize before halting of the first gas flow. As such, operational times can be reduced, throughput can be increased, and gas effects (such as non-uniformity and non-selectivity due to gas residence time) can be mitigated. For example, the tail portions of the first reactive gas R1 can be exhausted from the first set of flow levels 153a without depositing on the one or more substrates 107. Process parameters (such as pressure, temperature, flow rate, and/or gas concentration) can be optimized due to reduced effects of residual gases on the substrates 107. The stabilization can include, for example, ramping up and/or ramping down of pressure and/or temperature of the first gas flow. In one or more embodiments, the method includes halting the flow of the first gas flow after the moving of the one or more substrates 107 away from the first set of flow levels 153a is initiated.

Figure 3C:
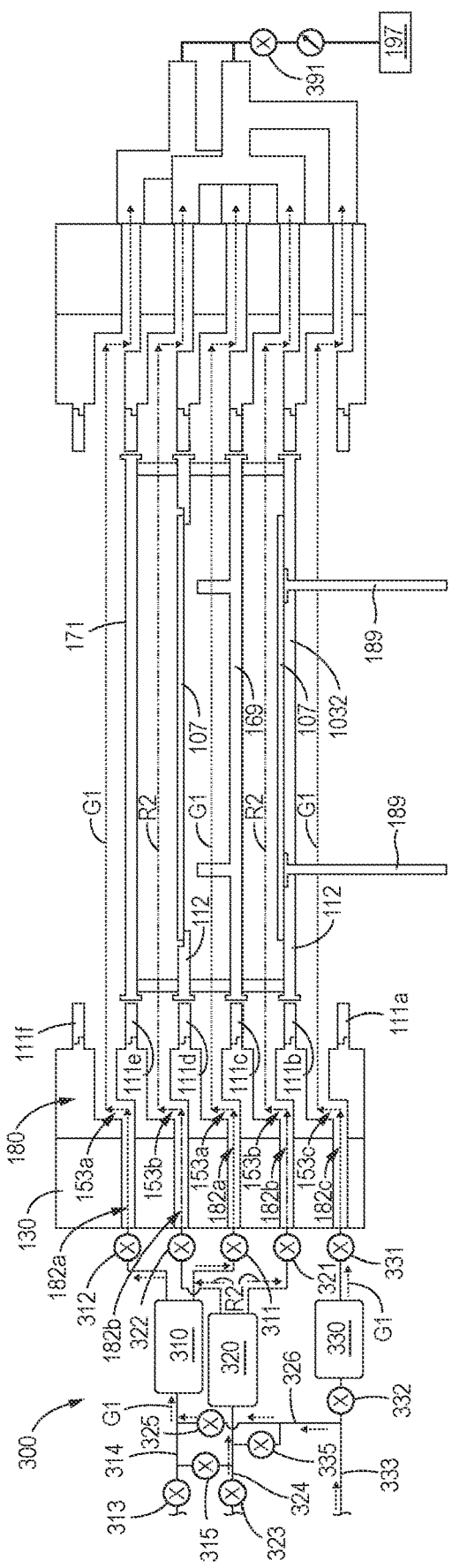

As shown in FIG. 3C, the method includes flowing a second reactive gas R2 into the second set of flow levels 153b while the one or more substrates 107 are in the second position. The second set of flow levels 153b correspond respectively to the first sides of the plurality of substrates 107 when in the second position such that the second reactive gas R2 respectively processes layers formed on the substrates 107 in FIG. 3A. For example, the second reactive gas R2 can respectively form a layer on, clean (such as pre-clean), or etch—respectively—the layers formed in FIG. 3A. As an example, the second reactive gas R2 can form a second layers respectively on the layers (formed in FIG. 3A) of the plurality of substrates 107. The second reactive gas R2 has a different composition than the first reactive gas R1. In FIG. 3C, the first supply valve 313 is closed to halt the first reactive gas R1, and the second connection valve 325 is opened to supply the inert gas G1 to the first set of flow levels 153a through the connection line 326, the third connection valve 335 is closed, and the second supply valve 323 is opened to supply the second reactive gas R2 through the second supply line 324 and the second set of valves 321, 322.

Figure 3D:
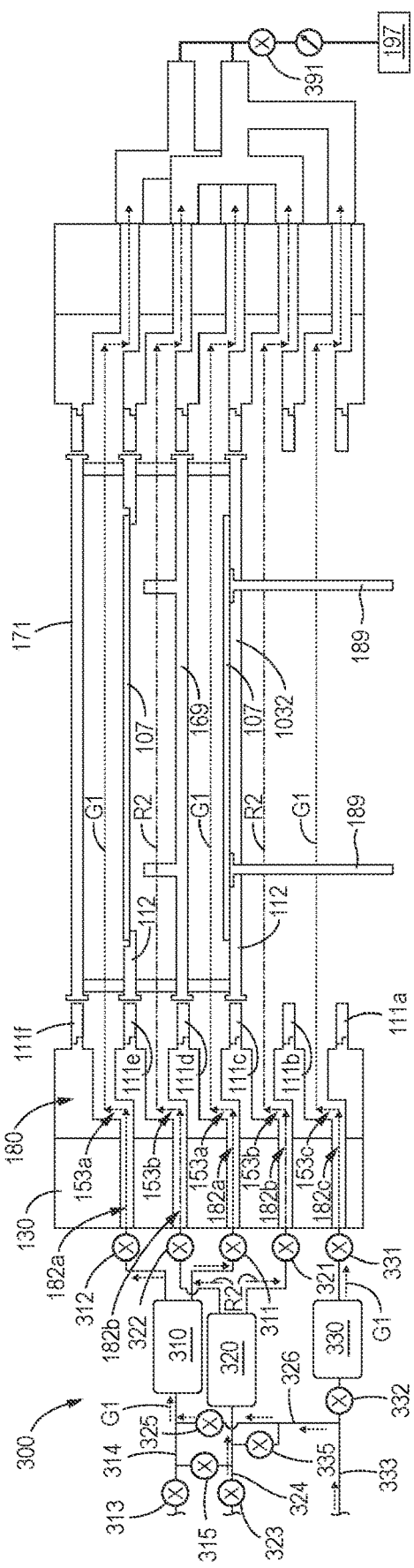

As shown in FIG. 3D, the method includes moving the one or more substrates 107. In one or more embodiments, the one or more substrates are moved from the second position to the first position (e.g., an upper position). The one or more substrates 107 are moved away from the respective second flow levels of the second set of flow levels 153b while the second gas flow (e.g., the second reactive gas R2) flows into the second set of flow levels 153b. As the one or more substrates 107 move to the first position, the substrate support 1032 and the plate 169 respectively isolate (e.g., at least partially) the lower substrate 107 and the upper substrate 107 from the second gas flow. In one or more embodiments, the one or more substrates 107 are moved to the first position without waiting for the second gas flow (e.g., the second reactive gas R2) to stabilize before halting of the second gas flow. The stabilization can include, for example, ramping up and/or ramping down of pressure and/or temperature of the second gas flow. In one or more embodiments, the method includes halting the flow of the second gas flow after the moving of the one or more substrates 107 away from the second set of flow levels 153b is initiated.

The present disclosure contemplates that the arcuate support 112 supporting the upper substrate 107 can be replaced with a second substrate support (supporting the upper substrate 107) that is similar to the substrate support 1032. The present disclosure also contemplates that from FIG. 3C, the substrates 107 can be moved down by a flow level to isolate the upper and lower substrates 107 from the second reactive gas R2.

Figure 3E:
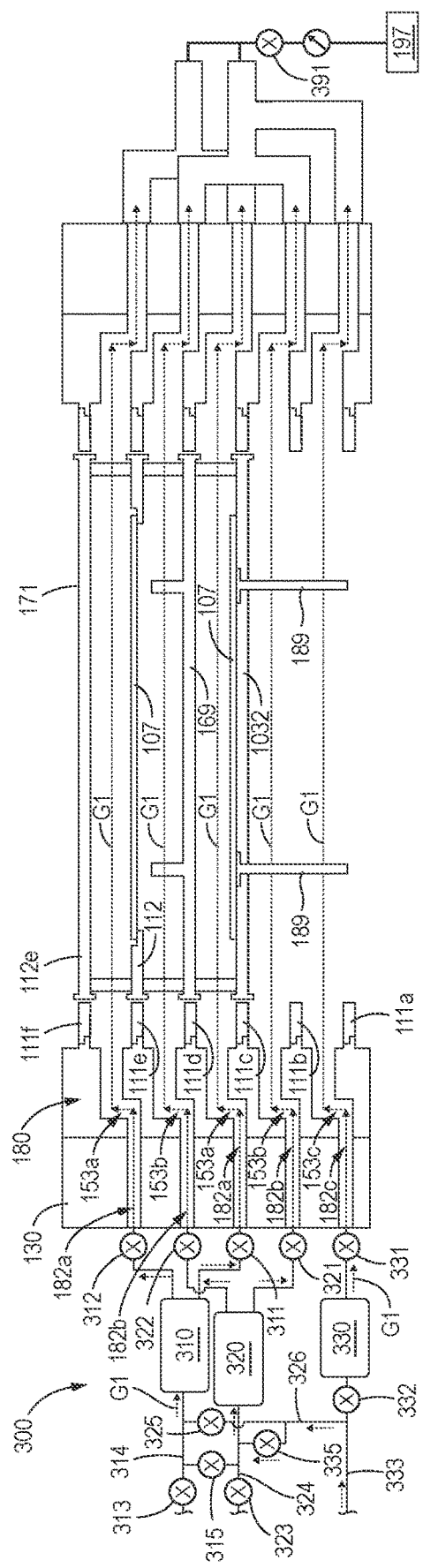

As shown in FIG. 3E, the method includes flowing the second gas flow (including the inert gas G1) into the second set of flow levels 153B simultaneously with the first set of flow levels 153A. In FIG. 3E, the second supply valve 323 is closed to halt the second reactive gas R2, and the third connection valve 335 is opened to supply the inert gas G1 to the second set of flow levels 153b through the connection line 326.

In one or more embodiments, the inert gas G1 includes a purge gas. In one or more embodiments, the first reactive gas R1 and the second reactive gas R2 each includes a deposition gas, a cleaning gas (e.g., for pre-cleaning the substrates 107 or cleaning components of the processing chamber 100), and/or an etching gas. The cleaning gas can include a plasma and/or atomic radicals. In one or more embodiments, the first reactive gas R1 is one of a deposition gas, an etching gas, or a cleaning gas, and the second reactive gas R2 is another of a deposition gas, an etching gas, or a cleaning gas.

The present disclosure contemplates that FIGS. 3C and 3D can be conducted prior to FIGS. 3A and 3B, the reactive gas R2 in FIGS. 3C and 3D is a pre-clean gas that cleans the substrate(s) 107 (e.g., to remove an oxide from the substrate(s) 107) and the reactive gas R1 in FIGS. 3A and 3B is a deposition gas that deposits layers on the cleaned substrate(s) 107. The second reactive gas R2 used for etching and/or pre-cleaning can include plasma and/or can be plasma-assisted. In one or more embodiments, the second reactive gas R2 includes atomic radicals, such as atomic hydrogen radicals and/or atomic argon radicals.

Figure 6:
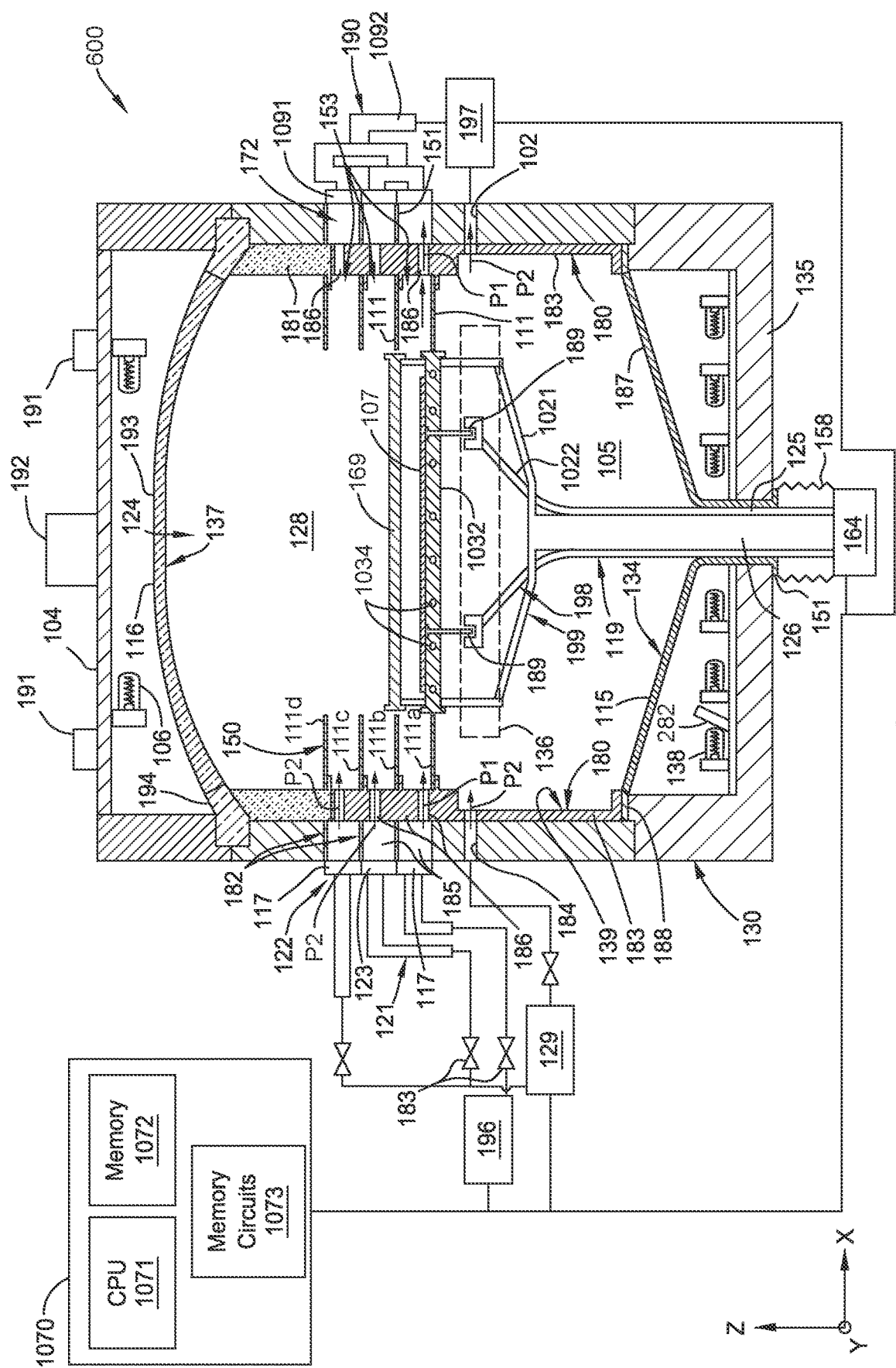
FIG. 6 is a schematic cross-sectional side view of a processing chamber, according to one or more embodiments.

The present disclosure contemplates that the processing chamber 100 and/or the method of FIGS. 3A-3E can be used to process a single substrate 107 at a time. As an example and as shown in FIG. 6, the second plate 171, the arcuate support 112, and the upper substrate 107 can be omitted, and the one or more support rod structures 1081 can be shortened and extended into the plate 169. As another example, a third plate (similar to the plate 169 and/or the second plate 171) can be used in place of the upper substrate 107 and/or the arcuate support 112. In such an embodiment, the first reactive gas R1 can flow into one flow level of the first set of flow levels 153a in FIGS. 3A and 3B, and the second reactive gas R2 can flow into one flow level of the second set of flow levels 153b in FIGS. 3C and 3D.

Figure 4:
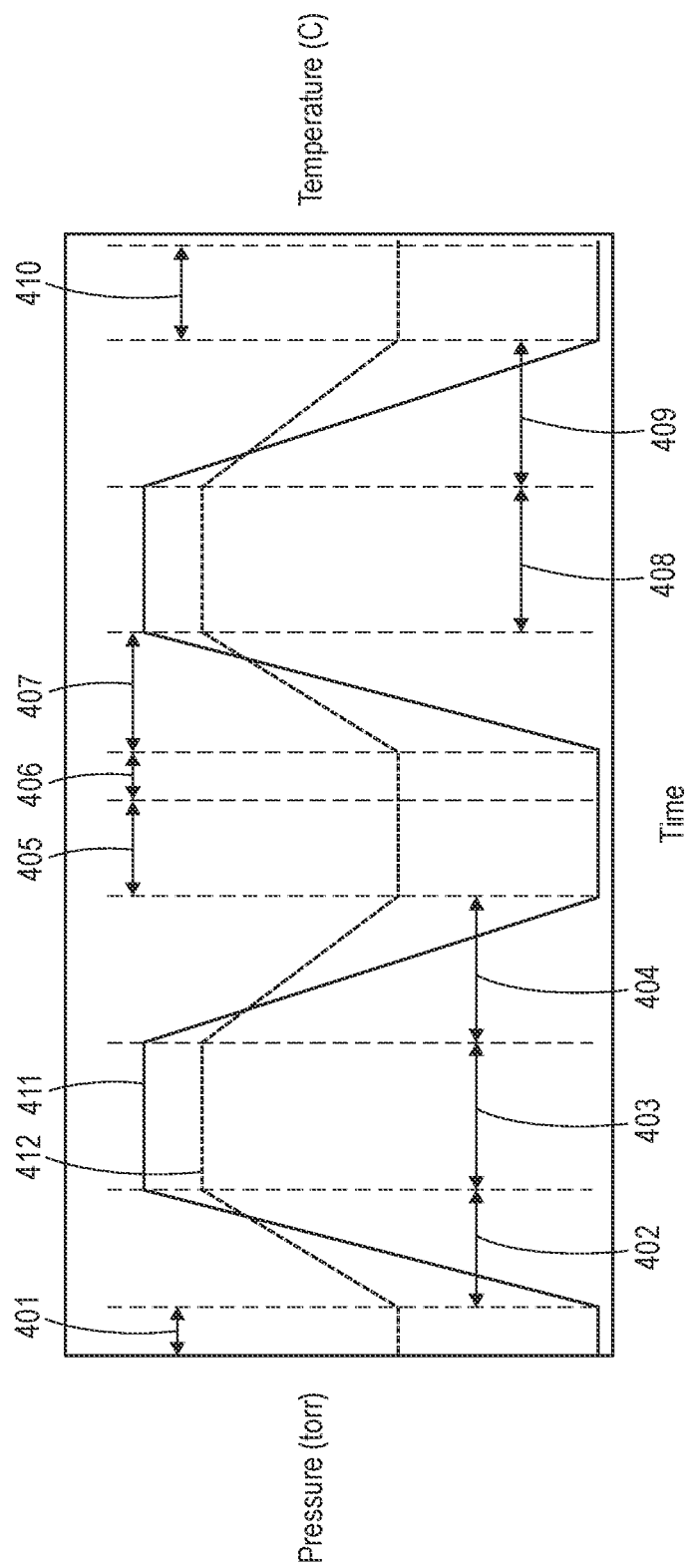
FIG. 4 is a schematic graphical view of sections of a method of substrate processing according to one or more embodiments.

FIG. 4 is a schematic graphical view of sections 401-410 of a method of substrate processing according to one or more embodiments. A first profile 411 plots pressure versus time, and a second profile 412 plots temperature versus time.

The method includes a first deposition operation 401 (e.g., FIG. 3A), a first ramp up operation 402 (e.g., FIG. 3B), a first etch operation 403 (e.g., FIG. 3C), and a first ramp down operation 404 (e.g., FIG. 3D), and a first purge operation 405 (e.g., FIG. 3E). The method of FIGS. 3A-3E can be repeated. For example, the method of FIG. 4 can include a second deposition operation 406 (e.g., FIG. 3A), a second ramp up operation 407 (e.g., FIG. 3B), a second etch operation 408 (e.g., FIG. 3C), and a second ramp down operation 409 (e.g., FIG. 3D), and a second purge operation 410 (e.g., FIG. 3E).

Figure 5:
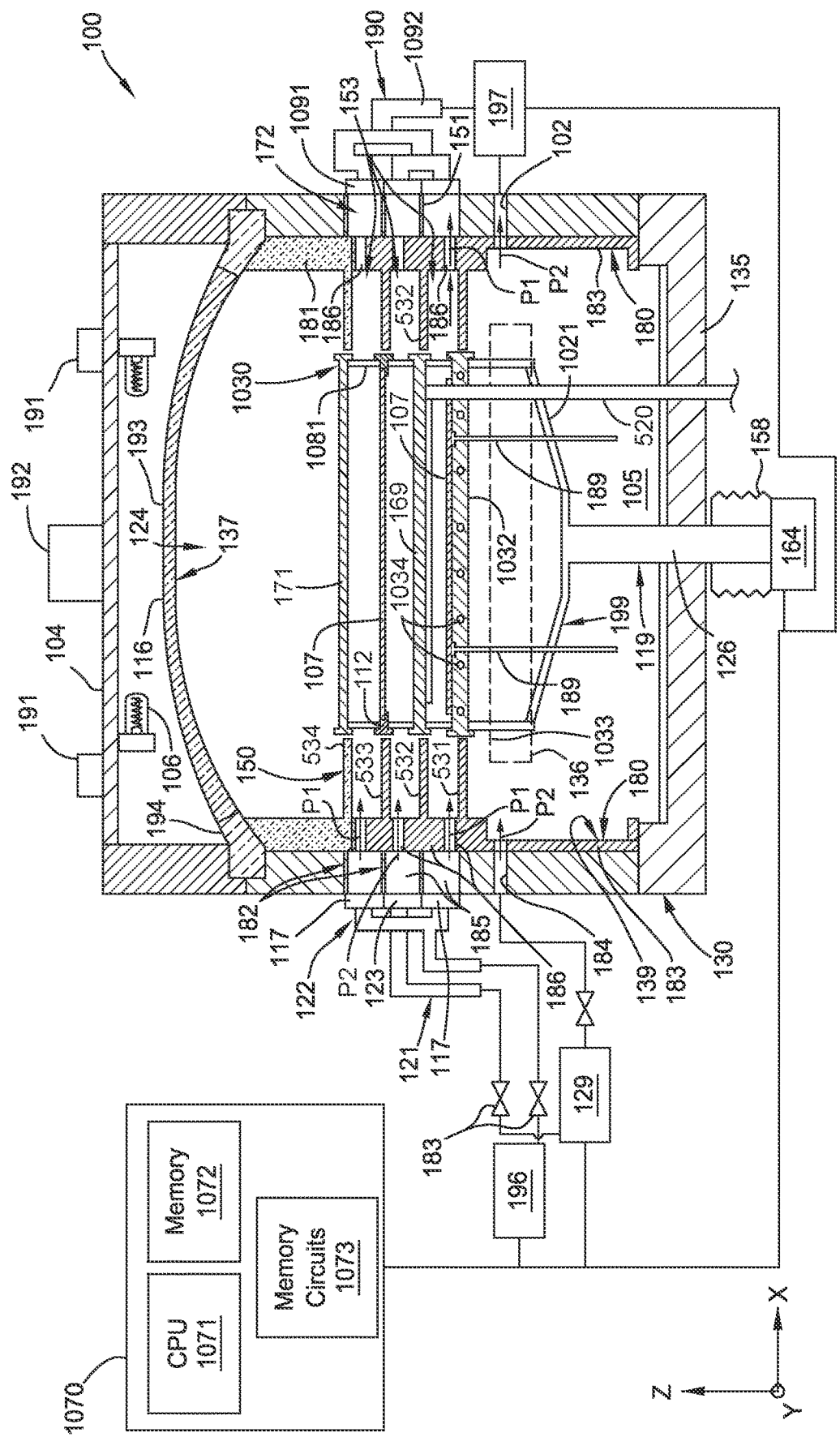
FIG. 5 is a schematic cross-sectional side view of a processing chamber, according to one or more embodiments.

FIG. 5 is a schematic cross-sectional side view of a processing chamber 500, according to one or more embodiments. The processing chamber 500 is similar to the processing chamber 100 shown in FIG. 1, and includes one or more aspects, features, components, operations, and/or properties thereof.

In the implementation shown in FIG. 5, the processing chamber 500 omits the lower heat sources 138, the lower window 115, and the second lift frame 198 are omitted. The lift pins 189 can abut against the base 135 of the chamber body 130. The base 135 can be metallic. For example, the base 135 can be formed of stainless steel and/or aluminum. A support structure 520 (such as one or more pins connected to a plate) is operable to lift and lower the plate 169 and/or the second plate 171. The support structure 520 is movable independently of the first lift frame 199 such that the plate 169 and/or the second plate 171 can be lifted and lowered relative to the lower substrate 107 and/or the upper substrate 107.

In the implementation shown in FIG. 5, the pre-heat rings 111a-111d are omitted and in place of the pre-heat rings 111a-111d, one or more protrusions 531-534 (e.g., ledges) of the respective one or more liners 181, 183 extend inwardly toward the cassette 1030.

FIG. 6 is a schematic cross-sectional side view of a processing chamber 600, according to one or more embodiments. The processing chamber 500 is similar to the processing chamber 100 shown in FIG. 1, and includes one or more aspects, features, components, operations, and/or properties thereof.

In the implementation shown in FIG. 6, the processing chamber 600 omits the second plate 171, the arcuate support 112, and the upper substrate 107, and the one or more support rod structures 1081 extend into the plate 169.

Figure 7:
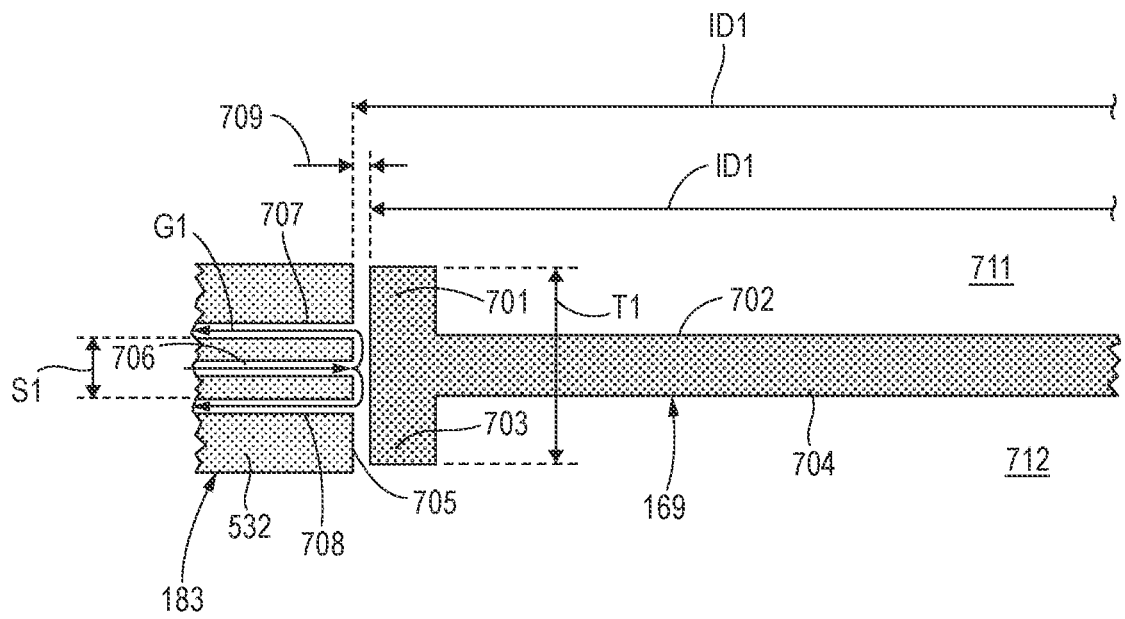
FIG. 7 is a schematic partial enlarged view of a protrusion of the lower liner shown in FIG. 5, according to one or more embodiments.

FIG. 7 is a schematic partial enlarged view of a protrusion 532 of the lower liner 183 shown in FIG. 5, according to one or more embodiments.

The plate 169 includes a first protrusion 701 extending relative to a first outer surface 702 of the plate 169, and a second protrusion 703 extending relative to a second outer surface 704 of the plate 169. In one or more embodiments, the first protrusion 701 surrounds the first outer surface 702 and the second protrusion 703 surrounds the second outer surface 704.

The lower liner 183 has an inner dimension ID1 that is larger than an outer dimension OD1 of the plate 169 to define a gap 709 between the inner dimension ID1 and the outer dimension OD1. The gap 709 is less than 1.0 mm. In one or more embodiments, the gap 709 is less than 0.8 mm, such as less than 0.5 mm. The lower liner 183 includes an inner face 705 and one or more first flow openings 706 extending into the inner face 705. The lower liner 183 includes one or more second flow openings 707 extending into the inner face 705 on a first side of the one or more first flow openings 706, and one or more third flow openings 708 extending into the inner face 705 on a second side of the one or more first flow openings 706. The inert gas G1 is supplied into the gap 709 through the one or first flow openings 706, and the inert gas G1 is exhausted (e.g., pumped) out of the gap 709 through the one or more second flow openings 707 and the one or more third flow openings 708. The one or more first flow openings 706 can be fluidly connected to the inert gas source 129 (such as through the third flow controller 330 and the valve 331). The one or more second flow openings 707 and the one or more third flow openings 708 can be fluidly connected to the one or more pump devices 197. In one or more embodiments, the inert gas G1 is a purge gas, such as nitrogen ($N_2$) and/or hydrogen ($H_2$). The flow openings 706, 707, 708 can respectively include a plurality of flow openings extending radially and spaced circumferentially from each other about the plate 169. By flowing and exhausting the inert gas G1 into and out of the gap 709 using the flow openings 706-708, the gap 709 functions as a virtual seal between the liner 183 and the plate 169.

The plate 169 is sized and shaped for positioning within the inner face 705 of the lower liner 183. The plate 169 includes at least one opaque outer surface. For example, the first outer surface 702 and/or the second outer surface 704 are opaque. The plate 169 has a solid cross section across the outer dimension OD1 of the plate 169.

The inert gas G1 in the gap 709 facilitates preventing gas in a first cavity 711 above the plate 169 and gas in a second cavity 712 below the plate 169 from flowing into the gap 709. The gap 709 and the inert gas G1 therein can function as a virtual seal (e.g., a seal without contact between the plate 169 and the lower liner 183, for example a dynamic seal) between the first cavity 711 and the second cavity 713. The gap 709 and the inert gas G1 therein can function as a gas bearing between the plate 169 and the lower liner 183 to facilitate movement of the plate 169 relative to the lower liner 183. A third cavity can be between the upper substrate 107 (if used) and the second plate 171 (if used). The gap 709, the one or more first flow openings 706, the one or more second flow openings 707, and the one or more third flow openings 708 are part of a gas seal between the substrate support 1032 and the lower liner 183. The present disclosure contemplates that the gas seal can respectively be used between the substrate support 1032 and the lower liner 183, the arcuate support 112 and the lower liner 183, and/or the second plate 171 and the upper liner 181. The present disclosure contemplates the substrate support 1032, the arcuate support 112, and/or the second plate 171 can respectively include a first protrusion (similar to the first protrusion 701) and a second protrusion (similar to the second protrusion 703)—as shown for example in FIG. 5.

The first protrusion 701 and the second protrusion 703 are at least part of an outer section of the plate 169 that is sized and shaped to span the one or more first flow openings 706, the one or more second flow openings 707, and the one or more third flow openings 708. A spacing S1 between the one or more second flow openings 707 and the one or more third flow openings 708 is less than a thickness T1 of the outer section of the plate 169. The present disclosure contemplates a variety of configurations for the outer section of the plate 169. For example, the present disclosure contemplates that the first protrusion 701 and/or the second protrusion 703 can be omitted, and/or the plate 169 can be thickened to encompass the first protrusion 701 and/or the second protrusion 703. The present disclosure contemplates that the first protrusion 701 and/or the second protrusion 703 can be rectangular in shape (e.g., square in shape) as shown in FIG. 7. The present disclosure also contemplates that the first protrusion 701 and/or the second protrusion 703 can be at least partially rounded and/or tapered. For example, the plate 169 can gradually thicken in a radially outward direction from a center of the plate 169 to form the first protrusion 701 and/or the second protrusion 703. Such subject matter described for the plate 169 (e.g., the increased thickness and/or the gradual thickness) can be used in relation to the substrate support 1032, the arcuate support 112, and/or the second plate 171 (such as to encompass and/or form the respective outer section, the respective first protrusion, and/or the respective second protrusion thereof). In one or more embodiments, the inert gas G1 is supplied to the gap 709 at a first pressure that is greater than atmospheric pressure (e.g., greater than 760 Torr).

Figure 8:
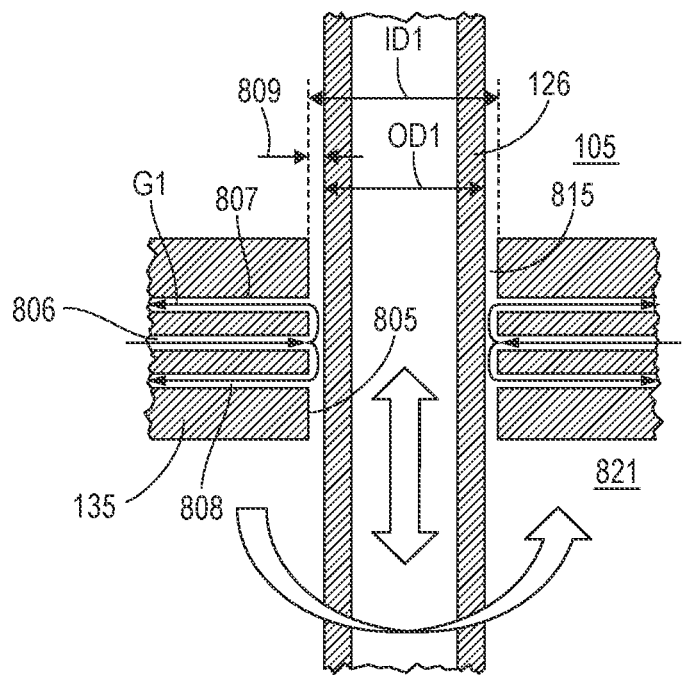
FIG. 8 is a schematic partial enlarged view of the shaft 126 and the base shown in FIG. 5, according to one or more embodiments.

FIG. 8 is a schematic partial enlarged view of the shaft 126 and the base 135 shown in FIG. 5, according to one or more embodiments.

The shaft 126 extends through a lift opening 815 of the base 135. The lift opening 805 at least partially defines an inner face 805. The inner face 805 has an inner dimension ID1 that is larger than an outer dimension OD1 of the shaft 126 to define a gap 809 between the inner dimension ID1 and the outer dimension OD1. The gap 809 is between the shaft 126 and the inner face 805 of the base 135. The gap 809 is less than 1.0 mm. In one or more embodiments, the gap 809 is less than 0.8 mm, such as less than 0.5 mm. The base 135 includes one or more first flow openings 806 extending into the inner face 805, one or more second flow openings 807 extending into the inner face 805 on a first side of the one or more first flow openings 806, and one or more third flow openings 808 extending into the inner face 805 on a second side of the one or more first flow openings 806. The inert gas G1 is supplied into the gap 809 through the one or first flow openings 706, and the inert gas G1 is exhausted (e.g., pumped) out of the gap 809 through the one or more second flow openings 807 and the one or more third flow openings 808. The one or more first flow openings 806 can be fluidly connected to the inert gas source 129 (such as through the third flow controller 330 and the valve 331). The one or more second flow openings 807 and the one or more third flow openings 808 can be fluidly connected to the one or more pump devices 197. The flow openings 806, 807, 808 can respectively include a plurality of flow openings extending radially and spaced circumferentially from each other about the shaft 126. The present disclosure contemplates that the gap 809 can be between the base 135 and the second shaft 125 of the second lift frame 198 (if the shaft 125 is used).

The inert gas G1 in the gap 809 facilitates preventing gas in the bottom region 105 and gas (such as atmospheric air) in an exterior 821 of the base 135 from flowing into the gap 809. The gap 809 and the inert gas G1 therein can function as a virtual seal (e.g., a seal without contact between the base 135 and the shaft 126, for example a dynamic seal) between the bottom region 105 and the exterior 821. The gap 809 and the inert gas G1 therein can function as a gas bearing between the shaft 126 and the base 135 to facilitate movement of the shaft 126 relative to the base 135. The present disclosure contemplates that a magnetic force (such as part of a magnetic coupling) acting on the shaft 126 and/or the base 135 can function as a magnetic bearing to facilitate movement of the shaft 126 relative to the base 135. For example, the shaft 126 can move easily and quickly (with reduced or eliminated friction) without using a lubricant. The shaft 126 can reliably and precisely position the cassette 1030, and the shaft 126 can be quickly accelerated with reduced or eliminated noise to quickly move the cassette 1030 between, for example, the positions shown in FIGS. 3A-3E and/or FIGS. 10A-10D. Operational times can be reduced by quickly moving the shaft using the gas seal between the shaft 126 and the base 135, and the processed substrate(s) can be quickly sealed from processing gas using the gas seal(s) between the cassette 1030 and the one or more liners 181, 183. The gap 809, the one or more first flow openings 806, the one or more second flow openings 807, and the one or more third flow openings 808 are part of a gas seal between the shaft 126 and the base 135.

In one or more embodiments, the inert gas G1 is supplied to the gap 809 at a second pressure that is greater than the first pressure. In one or more embodiments, the second pressure is at least 10% higher than the first pressure.

The present disclosure contemplates that a magnetic levitation assembly can be used in relation to the shaft 126. For example, magnetic forces can be used to lift, lower, and/or rotate the shaft 126. The magnetic levitation assembly can be used in addition to the flow openings 706, 707, 708 shown in FIG. 7. The magnetic levitation assembly can be used instead of the flow openings 806, 07, 808 shown in FIG. 8.

Figure 9:
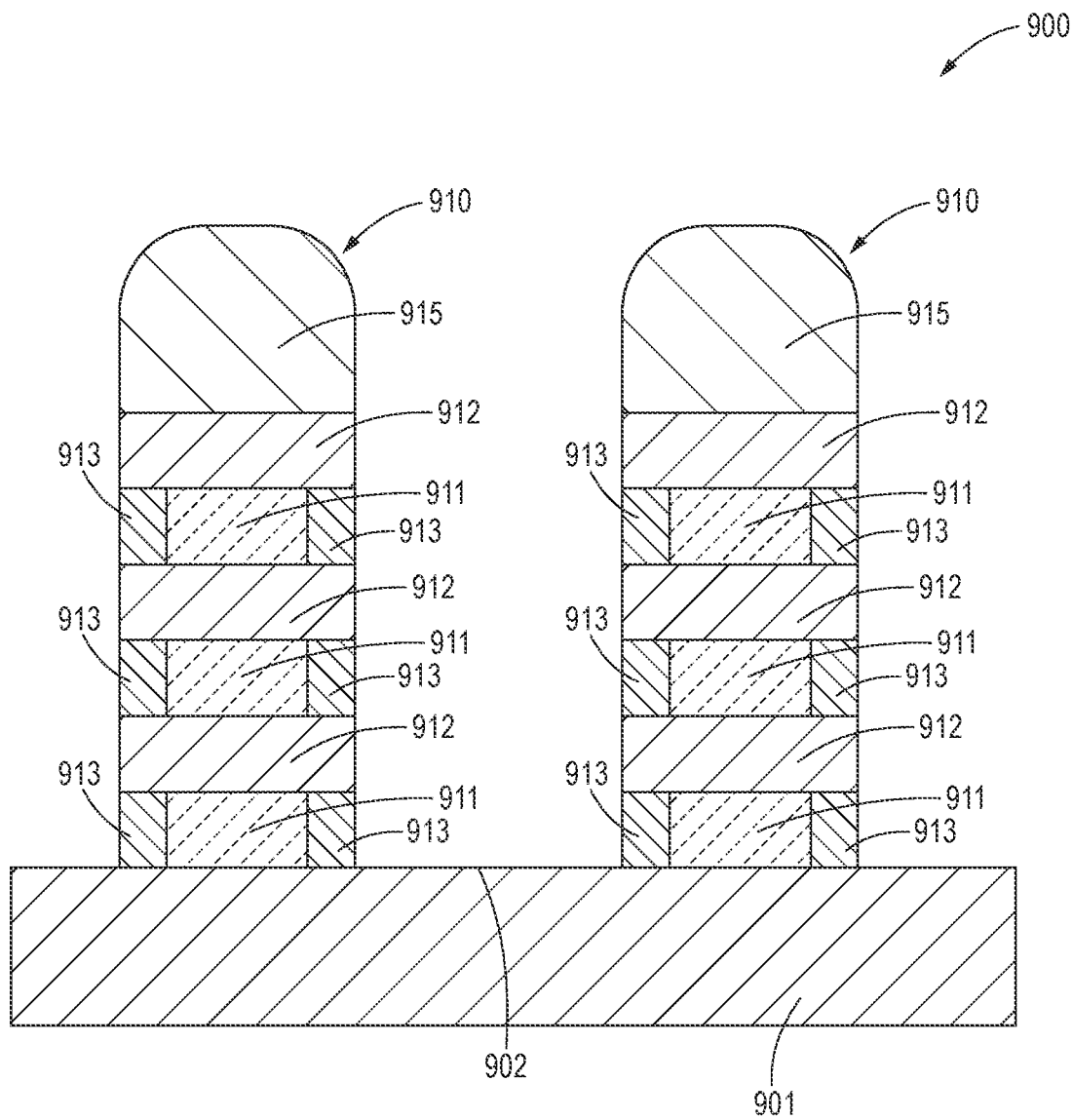
FIG. 9 is a schematic partial cross-sectional view of a semiconductor device structure, according to one or more embodiments.

FIG. 9 is a schematic partial cross-sectional view of a semiconductor device structure 900, according to one or more embodiments. The semiconductor device structure 900 can be made, for example, using one or more of the processing chamber and/or one or more of the methods described herein.

The structure 900 includes fins 910 formed on a silicon substrate 901. The fins 910 include silicon-germanium (SiGe) layers 911 and silicon (Si) layers 912 disposed in an alternating arrangement, and a cap layer 915. A plurality of silicon nitride (SiN) spacers 913 are disposed on both sides of the respective SiGe layers 911. Using subject matter described herein, it is believed that the flatness, uniformity, and/or selectivity of the structure 900 can be enhanced. As an example, the flatness of recessed surfaces 902 between the fins 910 and/or the flatness of outer surfaces of the silicon nitride (SiN) spacers 913 and/or the Si layers 912 can be enhanced. As another example, the merging of the fins 910 can be controlled.

FIGS. 10A-10D are schematic partial side cross-sectional views of the processing chamber 600 during a method of substrate processing.

Figure 10A:
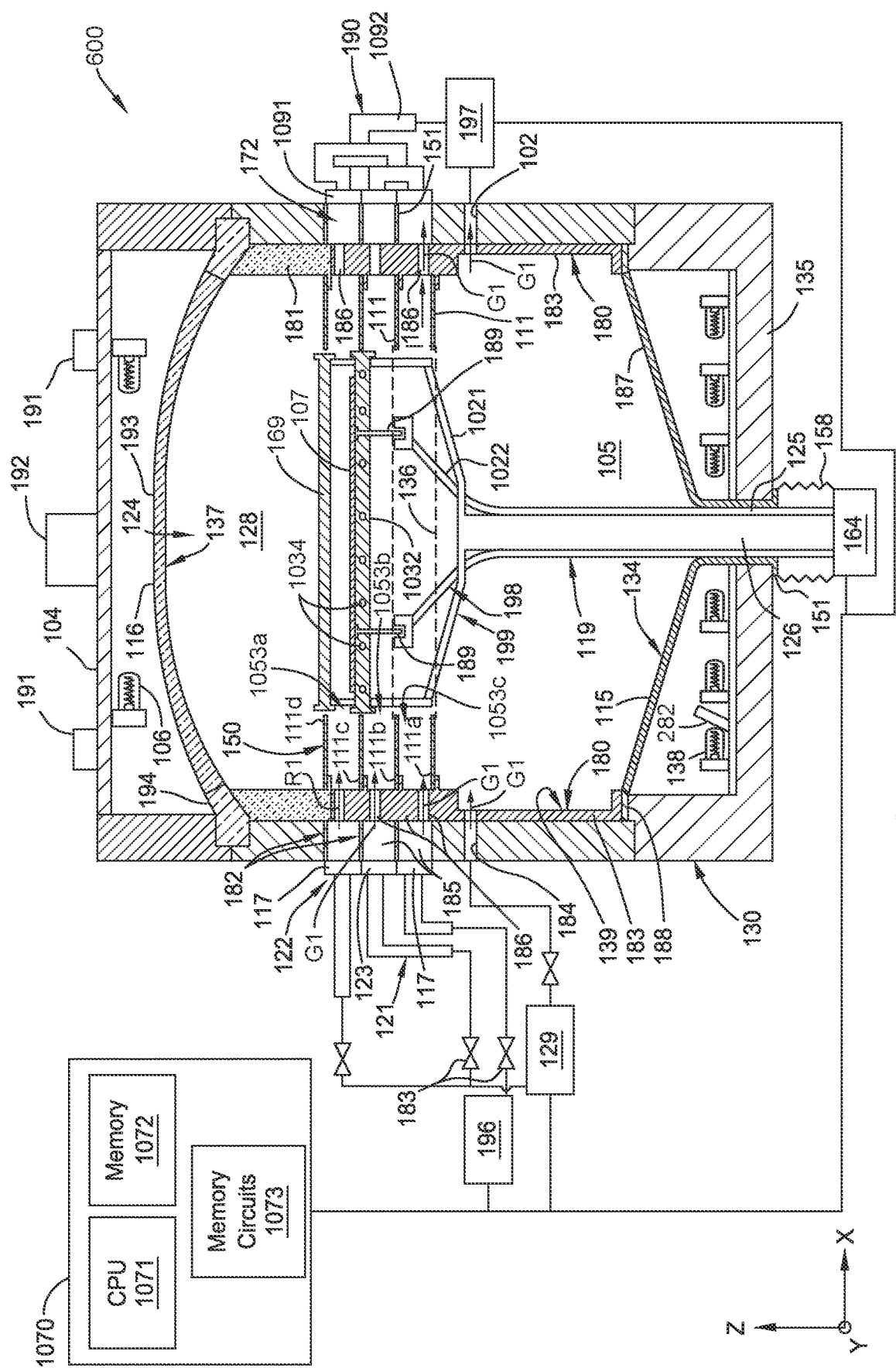
FIGS. 10A-10D are schematic partial side cross-sectional views of the processing chamber during a method of substrate processing.

As shown in FIG. 10A the method includes flowing a first gas flow into a first flow level 1053A of the processing chamber 600, and flowing a second gas flow into a second flow level 1053B of the processing chamber 600 simultaneously with the flowing of the first gas flow. In one or more embodiments, the first gas flow includes a first reactive gas R1 and the second gas flow includes an inert gas G1. The inert gas G1 can also flow to a third flow level 1053c.

Figure 10B:
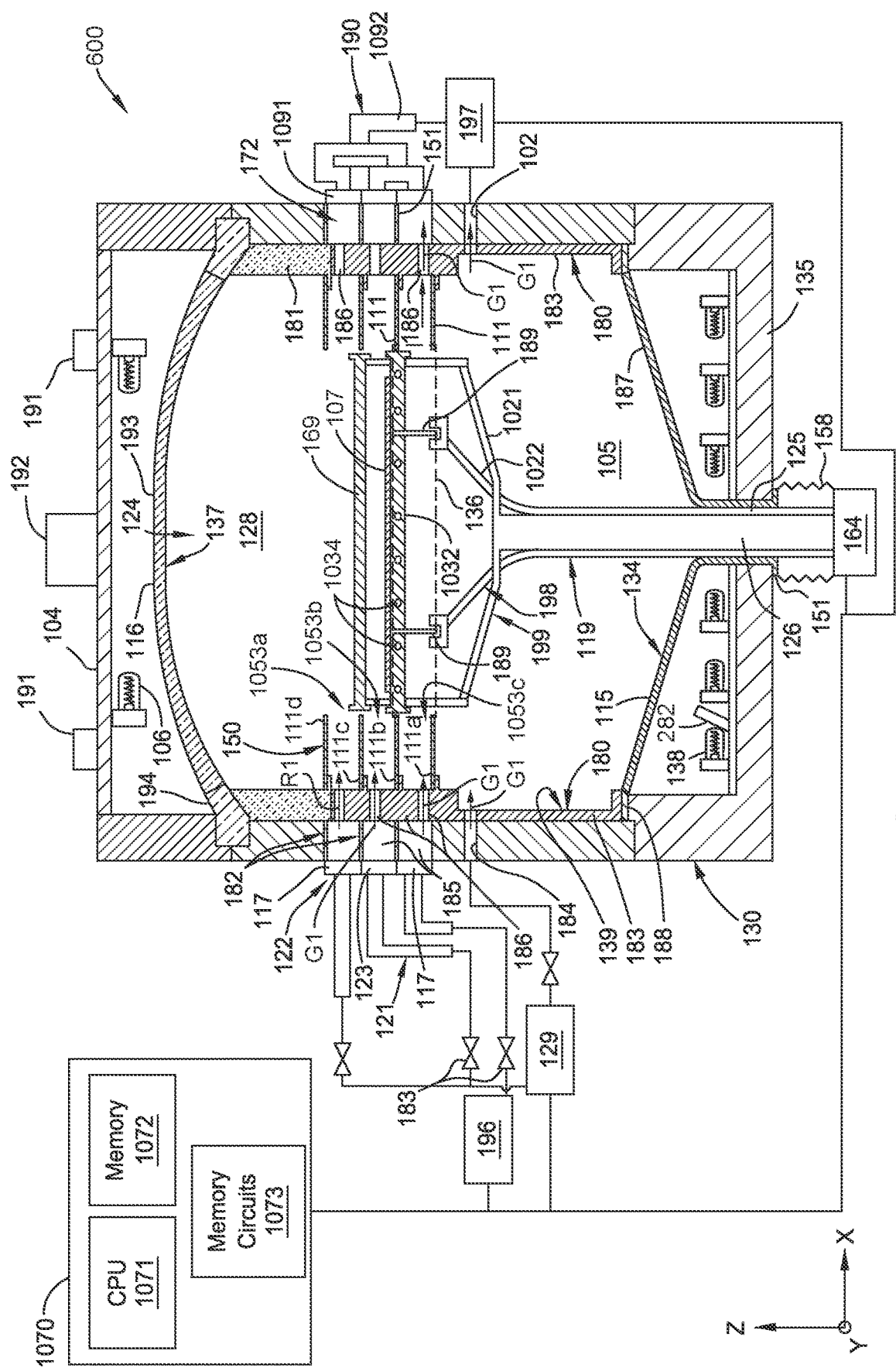

As shown in FIG. 10B, the method includes moving the one or more substrates 107 from the first position to a second position (e.g., a lower position). The substrate 107 is moved away from the first flow level 1053a while the first gas flow (e.g., the first reactive gas R1) flows into the first flow level 1053a. As the one or more substrates 107 move to the second position, the plate 169 isolates (e.g., at least partially) the substrate 107 from the first gas flow. In one or more embodiments, the substrate 107 is moved to the second position without waiting for the first gas flow (e.g., the first reactive gas R1) to stabilize before halting of the first gas flow. In one or more embodiments, the method includes halting the flow of the first gas flow after the moving of the substrate 107 away from the first flow level 153a is initiated. In one or more embodiments, the first gas flow is halted after the substrate 107 reaches the second position shown in FIG. 10B.

Figure 10C:
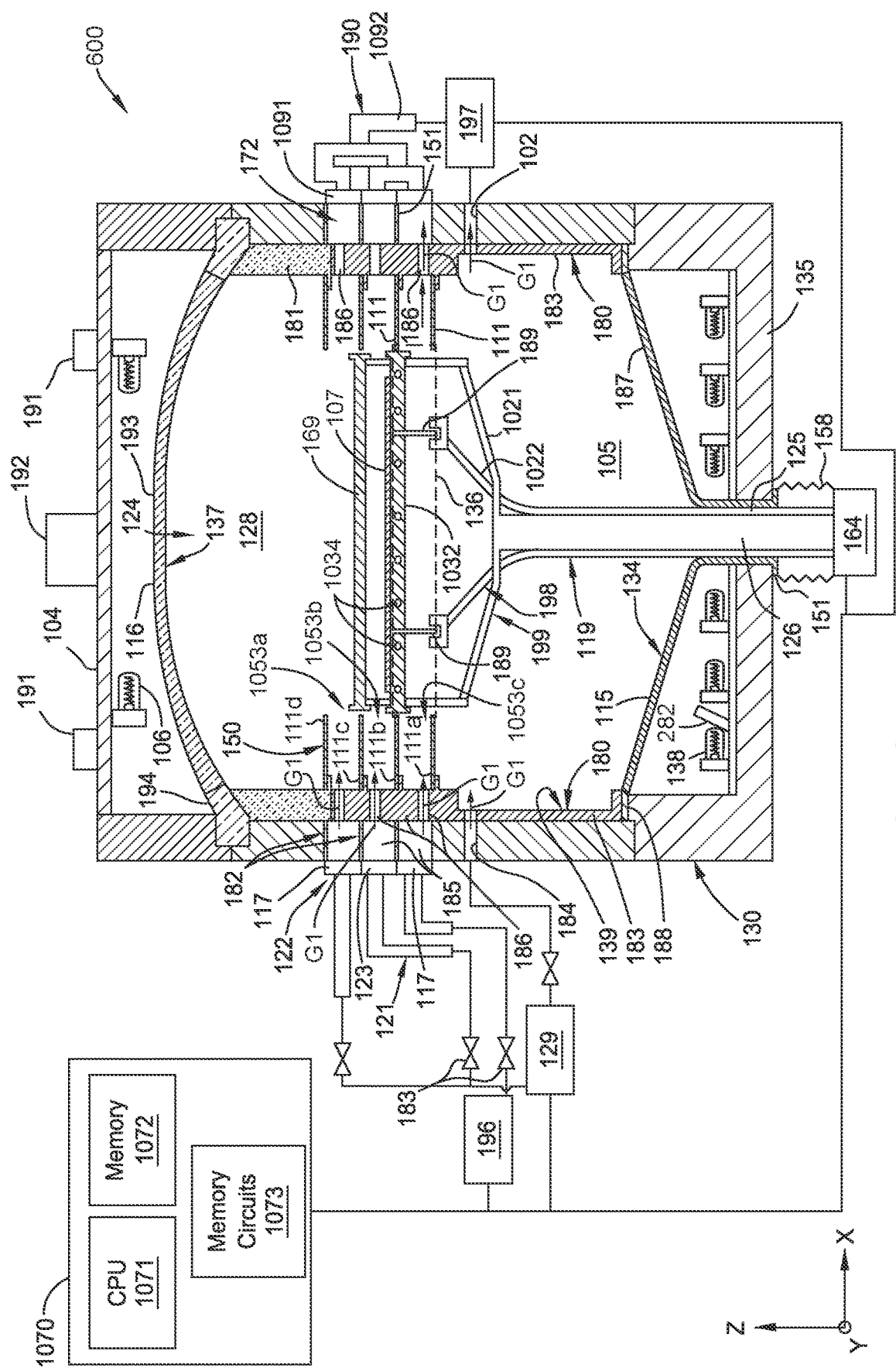

As shown in FIG. 10C, the method includes flowing the inert gas G1 into the first flow level 1053a while the substrate 107 is in the second position.

Figure 10D:
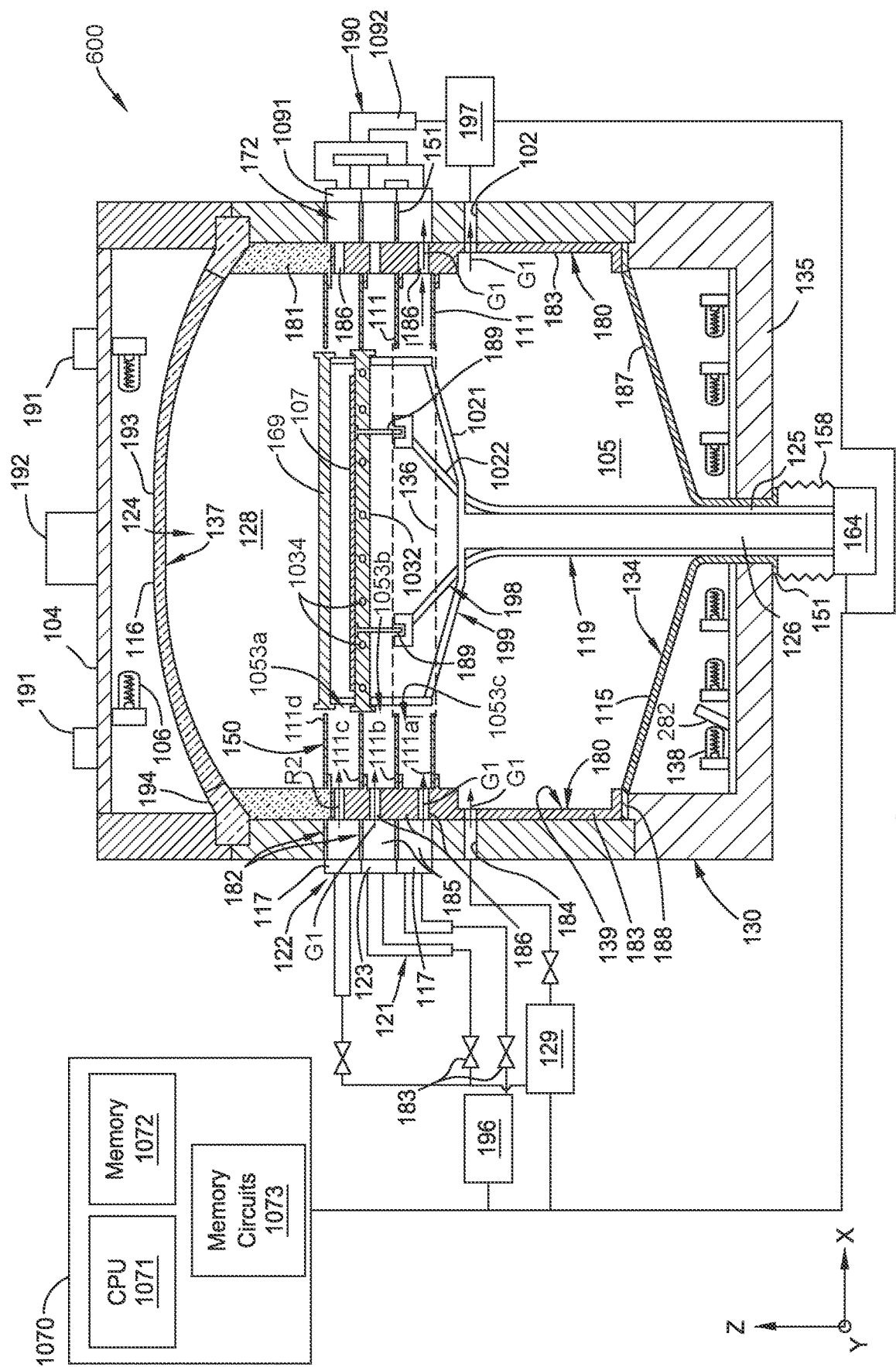

As shown in FIG. 10D, the method includes moving the substrate 107. In one or more embodiments, the substrate 107 is moved from the second position to the first position (e.g., an upper position). After the substrate 107 reaches the first position, a third gas flow (e.g., the second reactive gas R2) flows to the first gas level 1053a. In one or more embodiments, the first reactive gas R1 is a first deposition gas that deposits first layer(s) (e.g., silicon-germanium (SiGe) layers), and the second reactive gas R2 is a second deposition gas that deposits second layer(s) (e.g., silicon (Si) layers) on the first layer(s).

After FIG. 10D, the substrate 107 can be moved to the second position without waiting for the third gas flow (e.g., the second reactive gas R2) to stabilize before halting of the second gas flow. The third gas flow can then be halted and the inert gas G1 can flow to the first flow level 1053a. The substrate 107 can then be moved back to the first position and the above operations can be repeated starting with FIG. 10A. For example, the method can be repeated multiple times to deposit stacks of SiGe layers and Si layers in an alternating arrangement. After processing is complete, the substrate 107 can be moved down to align with the third flow level 1053c, and the lift pins 189 can be used to remove the substrate 107 through the opening 136. The opening 136 is at least partially aligned with the third flow level 1053c.

The present disclosure contemplates that FIG. 10D can be conducted prior to FIGS. 10A-10C. The present disclosure contemplates that the processing chamber 600 and/or the method of FIGS. 10A-10D can be used to process a plurality of substrates 107 at a time. As an example and as shown in FIGS. 3A-3E, the second plate 171, the arcuate support 112, and the upper substrate 107 can be added, and the one or more support rod structures 1081 can be lengthened.

Benefits of the present disclosure include modularity in processing applications (e.g. forming a variety of device structures—such as complex structures—and/or conducting a variety of operations) using a single processing chamber and/or a single gas circuit); uniformly forming ribbon structures and fin structures; forming deep structures; higher film growth rates; enhanced gas activation; uniform film growth and/or etching; increased throughput; reduced operation times (e.g., reduced processing times); enhanced selectivity; reduced changing of process recipes; and reduced chamber footprints. Benefits of the present disclosure also include enhanced device performance; enhanced sharpness of structures (e.g., enhanced boundaries between deposited layers and/or sharp transitions of Si layers to SiGe layers); and thermal control and adjustability for zones. Benefits also include mitigated gas residue effects, fast switching between processes art relatively low operation times (such as gas stabilization times); and reduced chamber memory effect.

Such benefits can be facilitated for processing a single substrate at a time, and/or batch processing a plurality of substrates simultaneously.

It is contemplated that one or more aspects disclosed herein may be combined. As an example, one or more aspects, features, components, operations, and/or properties of the various implementations of the processing chamber 100, the controller 1070, the gas circuit 300, the method shown in FIGS. 3A-3E, the method shown in FIG. 4, the processing chamber 500, the processing chamber 600, the gas seal shown in FIG. 7, the gas seal shown in FIG. 8, the semiconductor device structure 900, and/or the method shown in FIGS. 10A-10D may be combined. Moreover, it is contemplated that one or more aspects disclosed herein may include some or all of the aforementioned benefits.

While the foregoing is directed to embodiments of the present disclosure, other and further embodiments of the disclosure may be devised without departing from the basic scope thereof, and the scope thereof is determined by the claims that follow.

The invention claimed is:

1. A processing chamber applicable for semiconductor manufacturing, comprising:
   a chamber body at least partially defining a process volume, the chamber body comprising:
      a plurality of inject passages formed in the chamber body and arranged in a plurality of flow levels, and
      one or more exhaust passages formed in the chamber body;
   one or more heat sources operable to heat a processing volume;
   a substrate support disposed in the processing volume;
   a plate spaced from the substrate support, the substrate support and the plate movable by at least one flow level of the plurality of flow levels to align the substrate support between one or more first inject passages of a first flow level and one or more second inject passages of a second flow level, the plate comprising a first protrusion extending relative to a first outer surface of the plate;
   one or more first flow openings operable to flow a gas into a gap between the chamber body and the plate; and
   one or more second flow openings and one or more third flow openings operable to exhaust the gas out of the gap.

2. The processing chamber of claim 1, wherein the plate comprises at least one opaque outer surface, and the plate has a solid cross section across an outer dimension of the plate.

3. The processing chamber of claim 1, wherein the chamber body further comprises a liner at least partially lining a metallic body, and the gap is between the liner and the plate.

4. The processing chamber of claim 3, wherein the liner has an inner dimension that is larger than an outer dimension of the plate to define a gap between the inner dimension and the outer dimension.

5. The processing chamber of claim 4, wherein the gap is less than 1.0 mm.

6. The processing chamber of claim 3, wherein:
   the liner comprises an inner face;
   the one or more first flow openings extend into the inner face;
   the one or more second flow openings extend into the inner face on a first side of the one or more first flow openings; and
   the one or more third flow openings extend into the inner face on a second side of the one or more first flow openings.

7. The processing chamber of claim 1, wherein the plate further comprises a second protrusion extending relative to a second outer surface of the plate, wherein the first protrusion surrounds the first outer surface and the second protrusion surrounds the second outer surface.

8. The processing chamber of claim 1, further comprising a shaft extending through a lift opening of a metallic base of the processing chamber, wherein the shaft is coupled to the substrate support.

9. The processing chamber of claim 8, wherein the lift opening at least partially defines an inner face of the metallic base, and the metallic base comprises:
   one or more first flow openings extending into the inner face;
   one or more second flow openings extending into the inner face on a first side of the one or more first flow openings of the metallic base; and
   one or more third flow openings extending into the inner face on a second side of the one or more first flow openings of the metallic base.

10. The processing chamber of claim 9, wherein a gap between the shaft and the inner face of the metallic base is less than 1.0 mm.

11. A chamber kit applicable for semiconductor manufacturing, comprising:
   a liner comprising:
      an inner face,
      one or more first flow openings extending into the inner face,
      one or more second flow openings extending into the inner face on a first side of the one or more first flow openings, and
      one or more third flow openings extending into the inner face on a second side of the one or more first flow openings;
   a plate sized and shaped for positioning within the inner face of the liner, the plate comprising an outer section sized and shaped to span the one or more first flow openings, the one or more second flow openings, and the one or more third flow openings, the outer section of the plate comprising:
      a first protrusion extending relative to a first outer surface of the plate, and
      a second protrusion extending relative to a second outer surface of the plate, the first protrusion surrounding the first outer surface and the second protrusion surrounding the second outer surface.

12. The chamber kit of claim 11, wherein the plate comprises at least one opaque outer surface.

13. The chamber kit of claim 12, wherein the plate comprises silicon carbide (SiC), and the plate has a solid cross section across an outer dimension of the plate.

14. The chamber kit of claim 11, wherein:
   the liner has an inner dimension that is larger than an outer dimension of the plate to define a gap between the inner dimension and the outer dimension;
   the one or more first flow openings are operable to flow a gas into the gap; and
   the one or more second flow openings and the one or more third flow openings are operable to exhaust the gas out of the gap.

15. The chamber kit of claim 14, wherein the gap is less than 1.0 mm.

16. A chamber kit applicable for semiconductor manufacturing, comprising:
- a liner comprising:
  - an inner face,
  - one or more first flow openings extending into the inner face,
  - one or more second flow openings extending into the inner face on a first side of the one or more first flow openings, and
  - one or more third flow openings extending into the inner face on a second side of the one or more first flow openings;
- a plate sized and shaped for positioning within the inner face of the liner, the plate comprising an outer section sized and shaped to span the one or more first flow openings, the one or more second flow openings, and the one or more third flow openings, the liner having an inner dimension that is larger than an outer dimension of the plate to define a gap between the inner dimension and the outer dimension, the one or more first flow openings operable to flow a gas into the gap, and the one or more second flow openings and the one or more third flow openings operable to exhaust the gas out of the gap.

17. The chamber kit of claim 16, wherein the plate comprises at least one opaque outer surface.

18. The chamber kit of claim 16, wherein the plate comprises silicon carbide (SiC), and the plate has a solid cross section across the outer dimension of the plate.

19. The chamber kit of claim 16, wherein the gap is less than 1.0 mm.

* * * * *